(12) United States Patent
Saito et al.

(10) Patent No.: US 8,907,549 B2
(45) Date of Patent: Dec. 9, 2014

(54) TUNING FORK CONFIGURED TO GENERATE FLEXURAL VIBRATION IN REVERSE PHASE TO THE CONTOUR VIBRATION OF FIRST AND SECOND VIBRATING BODIES

(75) Inventors: Takefumi Saito, Saitama (JP); Noritoshi Kimura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 337 days.

(21) Appl. No.: 13/603,429

(22) Filed: Sep. 5, 2012

(65) Prior Publication Data

US 2013/0057115 A1 Mar. 7, 2013

(30) Foreign Application Priority Data

Sep. 5, 2011 (JP) ................... 2011-193053
Jul. 18, 2012 (JP) ................... 2012-159808

(51) Int. Cl.
*H03H 9/21* (2006.01)
*H03H 3/02* (2006.01)
*H03H 9/02* (2006.01)
*H03H 9/24* (2006.01)

(52) U.S. Cl.
CPC . *H03H 3/02* (2013.01); *H03H 9/21* (2013.01); *H03H 2009/02503* (2013.01); *H03H 2009/241* (2013.01)
USPC ............................ 310/370; 257/414; 333/187

(58) Field of Classification Search
CPC .......... H03H 2009/02291; H03H 2009/02346; H03H 2009/02338; H03H 2009/02503; H03H 2009/241; H03H 2009/2436; H03H 2009/2468; H03H 2003/022; H03H 2003/026; H03H 9/21

USPC ................... 310/370; 333/186–189; 257/414
See application file for complete search history.

(56) References Cited

U.S. PATENT DOCUMENTS

| 7,102,467 B2 * | 9/2006 | Lutz et al. | 333/186 |
| 7,221,241 B2 * | 5/2007 | Lutz et al. | 333/186 |
| 7,888,843 B2 * | 2/2011 | Ayazi et al. | 310/324 |
| 7,944,124 B1 * | 5/2011 | Bernstein | 310/346 |
| 7,990,232 B1 * | 8/2011 | Lee | 333/186 |
| 8,035,280 B2 * | 10/2011 | Li et al. | 310/351 |
| 8,319,584 B2 * | 11/2012 | Piazza et al. | 333/186 |

FOREIGN PATENT DOCUMENTS

| JP | 2005-159620 | 6/2005 |
| JP | 2005-348222 | 12/2005 |
| JP | 2006-041911 | 2/2006 |
| JP | 2007-535275 | 11/2007 |
| JP | 2008-124747 | 5/2008 |

* cited by examiner

*Primary Examiner* — J. San Martin
(74) *Attorney, Agent, or Firm* — Jianq Chyun IP Office

(57) ABSTRACT

A vibrator includes a base substrate, a tuning fork type vibrating body, a first vibrating body, a second vibrating body, a first extraction electrode at the one vibration arm portion, a second extraction electrode at the other vibration arm portion, and an input/output port at the base portion. The input/output port is configured to input/output an electric signal to/from each of the first extraction electrode, the second extraction electrode, and the excitation electrodes of the vibration arm portions. The tuning fork type vibrating body is configured to generate a flexural vibration in reverse phase to the contour vibration of the first and second vibrating bodies, so as to absorb the contour vibration of the first and second vibrating bodies.

14 Claims, 35 Drawing Sheets

TUNING FORK CONFIGURED TO GENERATE FLEXURAL VIBRATION IN REVERSE PHASE TO THE CONTOUR VIBRATION OF FIRST AND SECOND VIBRATING BODIES

CROSS-REFERENCE TO RELATED APPLICATION

This application claims the priority benefit of Japan application serial no. 2011-193053, filed on Sep. 5, 2011, and 2012-159808, filed on Jul. 18, 2012. The entirety of each of the above-mentioned patent applications is hereby incorporated by reference herein and made a part of this specification.

BACKGROUND OF THE INVENTION

1. Field of the Invention

This disclosure relates to a vibrator having excitation electrodes in each of upper and lower surfaces of a piezoelectric thin film, an electronic component having the vibrator, and a method of manufacturing the vibrator.

2. Description of Related Art

For example, as a vibrator based on a piezoelectric/inverse piezoelectric effect of a piezoelectric thin film made of aluminum nitride (AlN) and the like, there is known a disk resonator (vibrating body) in which the piezoelectric thin film is formed, for example, in a disk shape, and excitation electrodes made of, for example, molybdenum (Mo) and the like are formed in each of upper and lower surfaces of the piezoelectric thin film. In such a disk resonator, contour vibration is generated along a circumferential direction such that the piezoelectric thin film expands and contracts in a radial direction of the piezoelectric thin film by using a center of the piezoelectric thin film as a nodal point. In this regard, in order to support (fix) the disk resonator, for example, onto a silicon substrate using a simple structure while hindrance of contour vibration is suppressed, there is known a technique in which a pair of disk resonators are arranged side by side in a horizontal direction, the outer circumferences of the disk resonators are connected with a connecting portion, for example, having an approximately box shape, and the lower surface of the connecting portion is fixed to the silicon substrate.

That is, in order to vibrate the disk resonators in phase, the diameter, mass, or the like of the piezoelectric thin film are mutually aligned between the disk resonators. In addition, in order to provide the same electric potential between the upper excitation electrodes and between the lower excitation electrodes, an electric signal is input/output to/from the excitation electrodes through the connecting portion. Therefore, since a nodal point (or node) of the contour vibration is formed in the connecting portion, each disk resonator is supported while hindrance of contour vibration is suppressed. When the resonance frequency is adjusted after such a disk resonator is manufactured, the piezoelectric thin film or the excitation electrode of each of disk resonators is perforated, for example, through laser processing to change (reduce) rigidity or mass of the disk resonator.

Here, in a configuration having a pair of disk resonators connected with a connecting portion, vibration of the disk resonator is hindered by the connecting portion in practice as recognized from the simulation result described below, which is not an ideal vibration mode. For this reason, compared to a case where vibration is generated in an ideal vibration mode, the electric characteristic of the disk resonator is deteriorated. In addition, if a processing position, a processing amount, and the like are deviated between a pair of the disk resonators when the aforementioned laser processing is performed, vibration balance between the disk resonators is lost. Therefore, elastic energy may leak through the connecting portion, and the Q-value may be degraded. Japanese Application No. 2008-124747 discloses a pair of disk resonators connected with a connecting portion. In addition, the contour vibration type resonator is disclosed in Japanese Patent Application No. 2005-159620, Japanese Patent Application No. 2007-535275, Japanese Patent Application No. 2005-348222, and Japanese Patent Application No. 2006-41911. However, the aforementioned patent documents fail to discuss the aforementioned problems.

A need thus exists for a vibrator which is not susceptible to the drawback mentioned above.

SUMMARY OF THE INVENTION

According to an aspect of this disclosure, there is provided a vibrator that includes: a base substrate, a tuning fork type vibrating body, a first vibrating body, a second vibrating body, a first extraction electrode at the one vibration arm portion of a pair of vibration arm portions, a second extraction electrode at the other vibration arm portion of the pair of vibration arm portions, and an input/output port at the base portion. The tuning fork type vibrating body includes a base portion, the pair of vibration arm portions having a pair of first excitation electrodes. The base portion is supported by the base substrate. The pair of vibration arm portions extends from the base portion away from each other. Each of the pair of vibration arm portions includes a piezoelectric body. The pair of first excitation electrodes sandwiches each of the vibration arm portions. The first vibrating body includes a vibration plate with a piezoelectric thin film and a pair of second excitation electrodes. The piezoelectric thin film is connected to one vibration arm portion of the pair of vibration arm portions at an outer circumference of the piezoelectric thin film. The pair of second excitation electrodes sandwiches the piezoelectric thin film in a thickness direction. The first vibrating body is configured to generate a contour vibration by performing expansion and contraction between a center and the outer circumference of the piezoelectric thin film. The second vibrating body includes a vibration plate with a piezoelectric thin film and a pair of third excitation electrodes. The piezoelectric thin film is connected to the other vibration arm portion of the pair of vibration arm portions at an outer circumference of the piezoelectric thin film. The pair of third excitation electrodes sandwiches the piezoelectric thin film in a thickness direction. The second vibrating body is configured to generate a contour vibration in phase with the contour vibration of the first vibrating body. The first extraction electrode is connected to the second excitation electrode of the first vibrating body. The second extraction electrode is connected to the third excitation electrode of the second vibrating body. The input/output port is configured to input/output an electric signal to/from each of the first extraction electrode, the second extraction electrode, and the first excitation electrodes of the vibration arm portions. The tuning fork type vibrating body is configured to generate a flexural vibration in reverse phase to the vibration of the first and second vibrating bodies, so as to absorb the contour vibration of the first and second vibrating bodies.

BRIEF DESCRIPTION OF THE DRAWINGS

The foregoing and additional features and characteristics of this disclosure will become more apparent from the following detailed description considered with the reference to the accompanying drawings.

DESCRIPTION OF THE EMBODIMENTS

First Embodiment

A first embodiment disclosed here will be explained with reference to the attached drawings.

Figure 1:
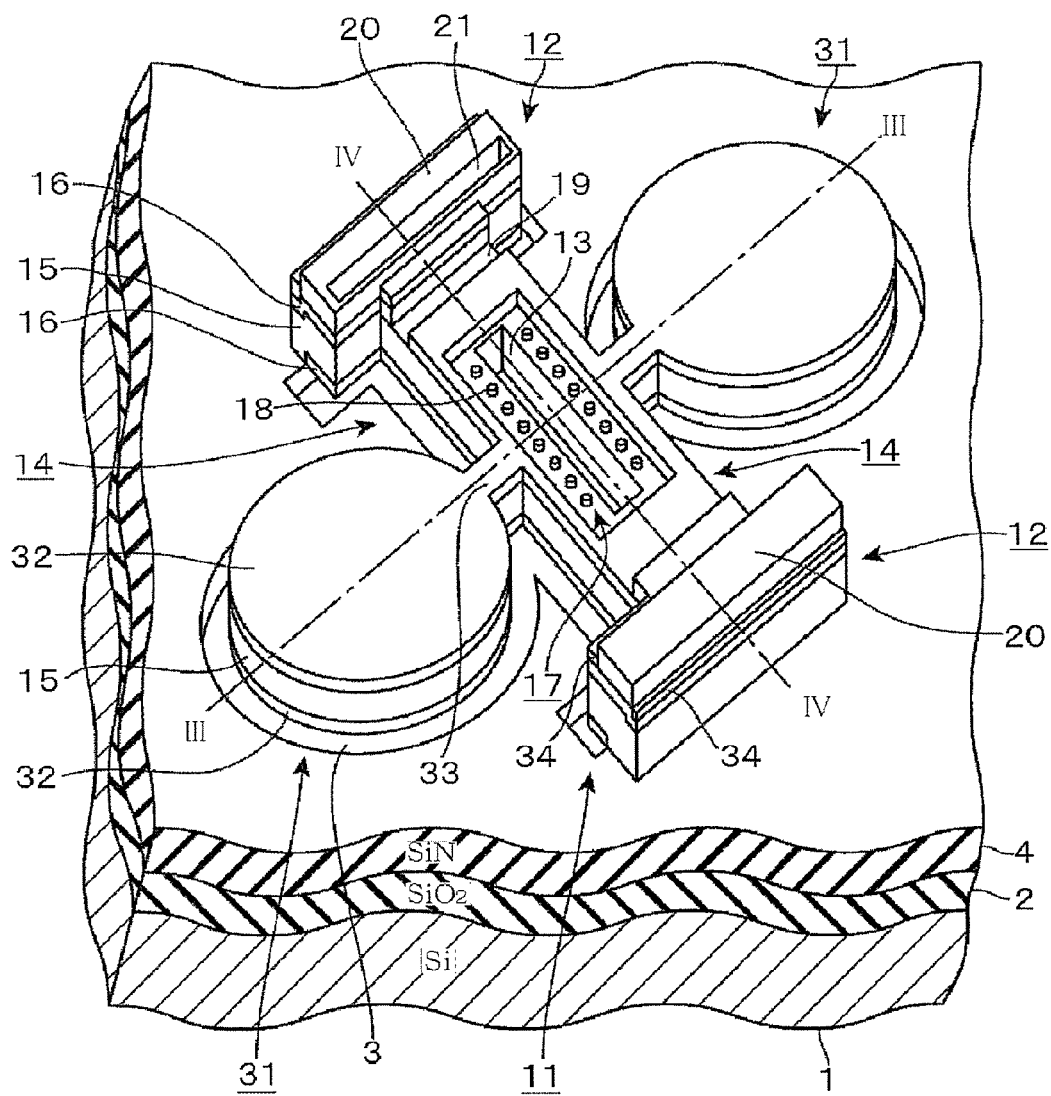
FIG. 1 is a perspective view illustrating an example of a vibrator according to a first embodiment of this disclosure.
Figure 2A:
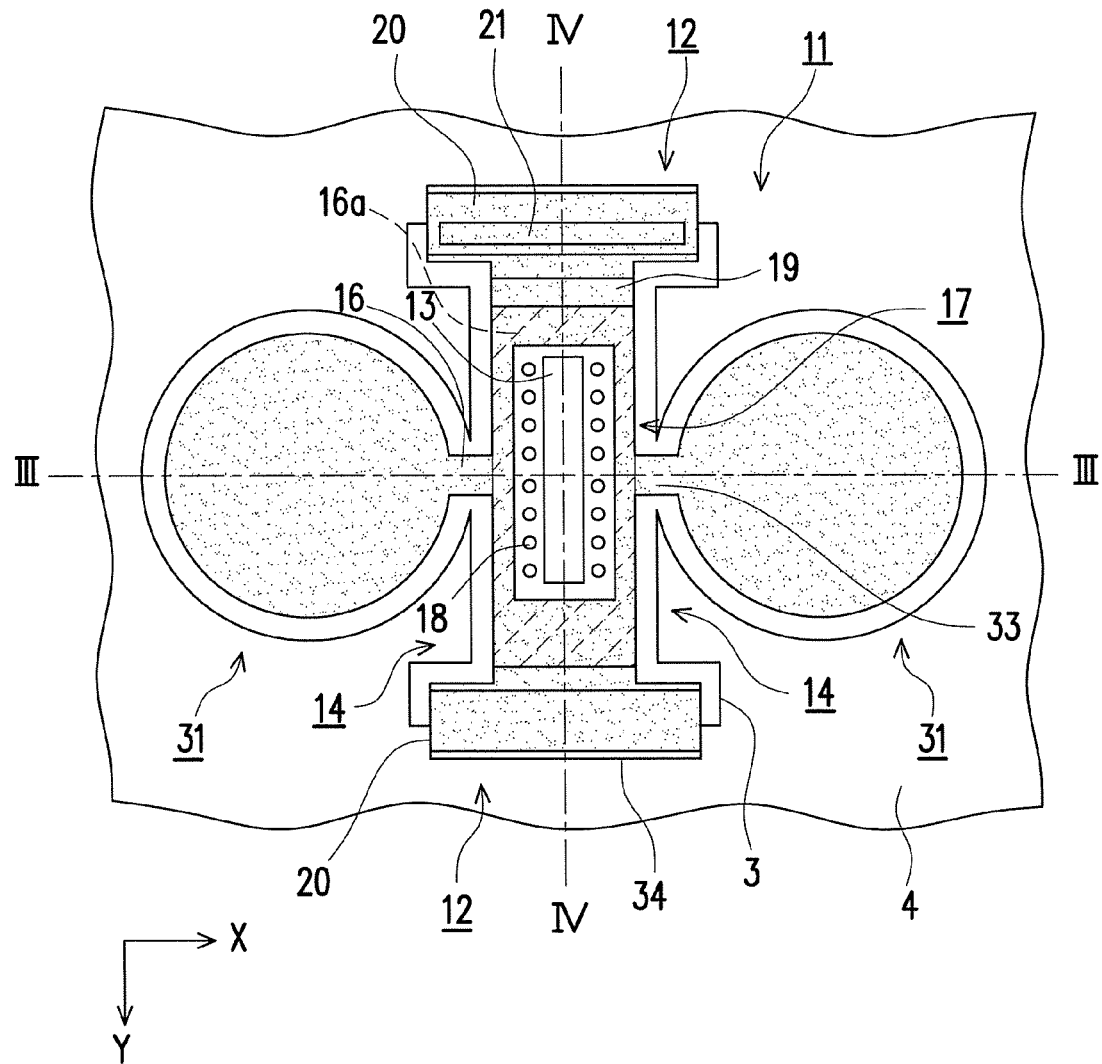
FIG. 2A is a top plan view illustrating the vibrator in which excitation electrodes of the vibration arm portions are shown.
Figure 2B:
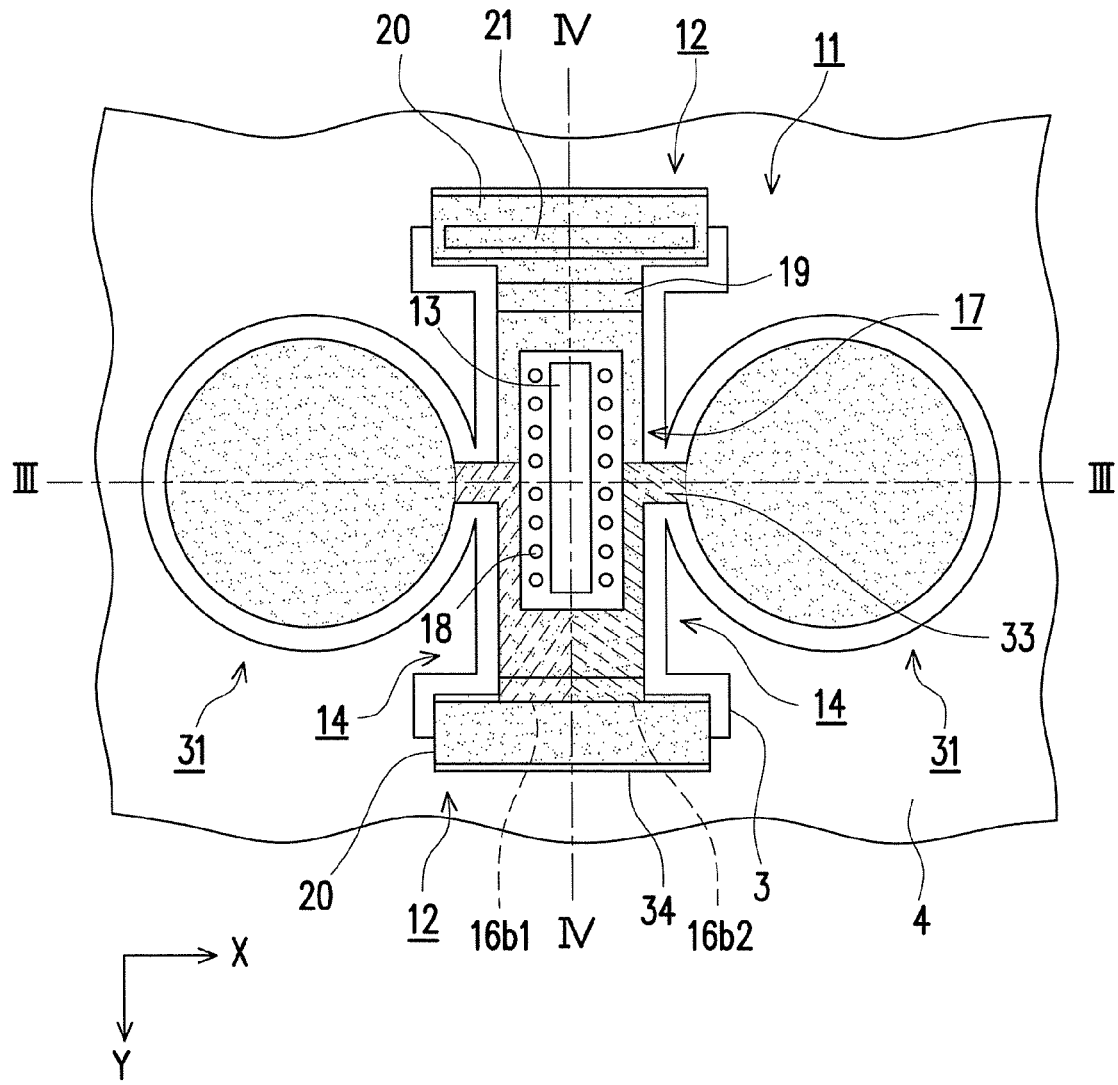
FIG. 2B is a top plan view illustrating the vibrator in which extraction electrodes of the vibrator are shown.
Figure 3:
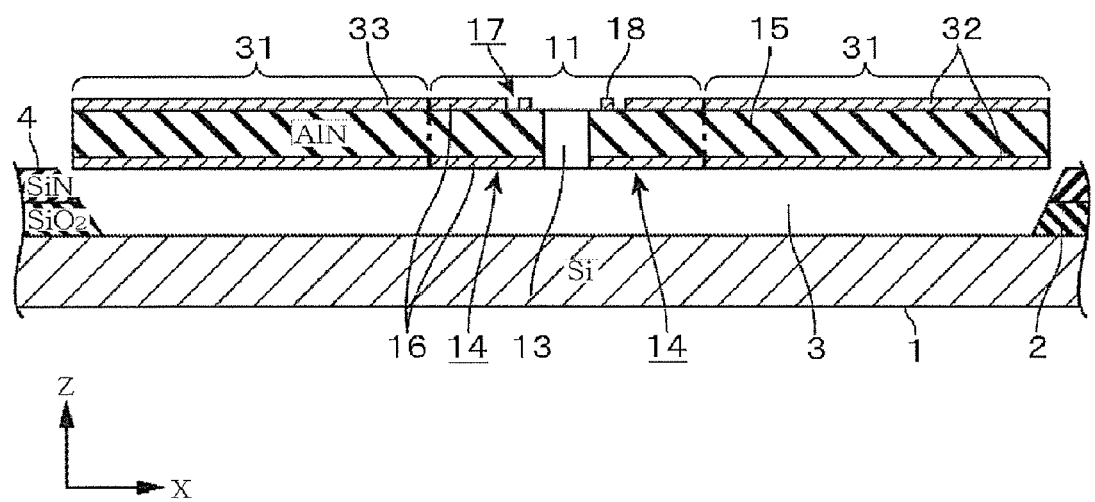
FIG. 3 is a vertical cross-sectional view illustrating the vibrator.
Figure 4:
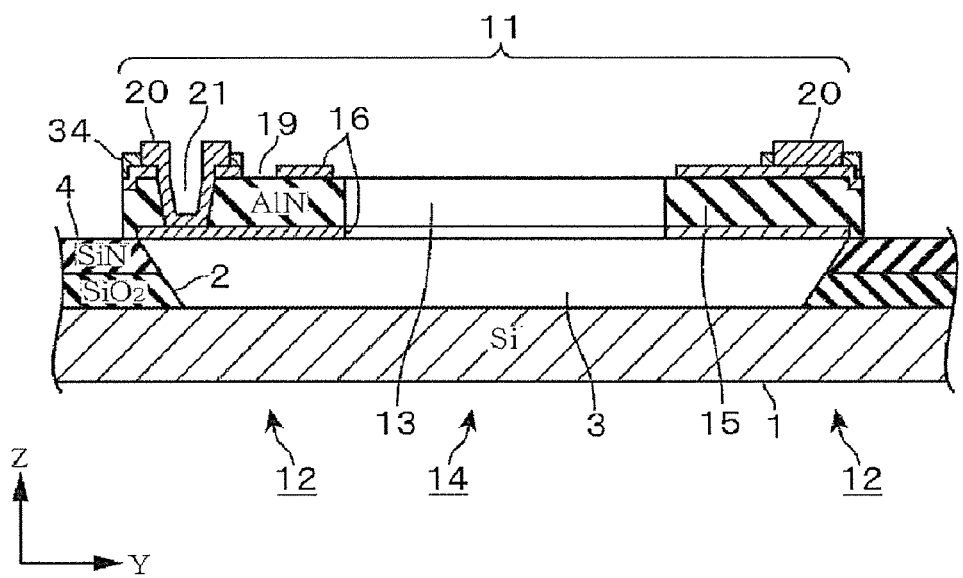
FIG. 4 is a vertical cross-sectional view illustrating the vibrator.

An example of the vibrator according to a first embodiment of this disclosure will be described with reference to FIG. 1 to FIG. 4. The vibrator is provided over a base substrate 1 made of, for example, silicon (Si) and the like. As illustrated in FIG. 1, FIG. 2A and FIG. 2B, the vibrator includes a tuning fork type vibrating body 11 supported by the base substrate 1 (specifically, nitride film 4 described below) and disk resonators 31 and 31 (a pair of disk resonators 31 and 31) which are approximately disk-shaped vibration bodies connected to both left and right sides (X direction in FIG. 1) of the tuning fork type vibrating body 11. The disk resonators 31 and 31 are supported by the tuning fork type vibrating body 11 so as to float over the base substrate 1, as illustrated in FIG. 3. In addition, as described below, each disk resonator 31 and 31 is configured such that contour vibration is not hindered by the tuning fork type vibrating body 11, or hindrance of contour vibration is suppressed when the contour vibration caused by performing expansion and contraction between the center and the outer circumference along the circumferential direction is generated. Hereinafter, the tuning fork type vibrating body 11 and the disk resonator 31 and 31 will be described in detail. Note that FIG. 3 and FIG. 4 illustrate a vertical cross section obtained by cutting the vibrator along lines III-III and IV-IV of FIG. 1, FIG. 2A and FIG. 2B, respectively. In FIG. 1 to FIG. 4, the base substrate 1 is illustrated as being partially cut away.

Over the base substrate 1, an oxide film 2 made of, for example, silicon oxide and the like and a nitride film 4 made of, for example, silicon nitride and the like are sequentially stacked from the down side in this order. The aforementioned tuning fork type vibrating body 11 is supported (fixed) on the nitride film 4 such that the center in the longitudinal direction (Y direction in FIG. 2A and FIG. 2B) floats over the oxide film 2 and the nitride film 4. That is, a hollow portion 3 having a dimension approximately larger than that of the vibrator is formed in the oxide film 2 and the nitride film 4. One end side and the other end side of the tuning fork type vibrating body 11 in the longitudinal direction extend to the far side and the near side, respectively, from the hollow portion 3, and these extending portions are fixed on the nitride film 4. In the tuning fork type vibrating body 11, each of the far-side area and the near-side area fixed on the nitride film 4 (specifically, the area slightly close to the center in addition to these areas) extend left and right directions to form the base portions 12 and 12. The electrode structure of the base portion 12 and 12 will be described below. Note that, in FIG. 2A and FIG. 2B, the area where the metal film 16, the excitation electrodes 32, and the like descried below are formed in the tuning fork type vibrating body 11 and the disk resonators 31 and 31 is hatched in order to distinguish from the area where the piezoelectric thin film 15 is exposed.

In a portion held in a floating state over the nitride film 4 between the base portions 12 and 12, an opening 13 extending along the length of the tuning fork type vibrating body 11 is formed to vertically penetrate the tuning fork type vibrating body 11 in the center of the portion held in a floating state. Therefore, the areas extending in a forward-backward direction to connect the base portions 12 and 12 in the left and right sides of the opening 13 constitute the vibration arm portions 14 and 14, respectively, in the tuning fork type vibrating body 11. That is, as illustrated in FIG. 4, each of the vibration arm portions 14 and 14 includes a piezoelectric thin film 15 made of aluminum nitride (AlN) and the like and a metal film 16 and 16 made of molybdenum (Mo) and the like and is formed to interpose the piezoelectric thin film 15 in a vertical direction. The vibration arm portions 14 and 14 are configured such that flexural vibration is generated in the horizontal direction as a voltage is applied between the metal films 16 and 16 as described below. The lengths and the widths of each vibration arm portion 14 and 14 are adjusted such that the resonance frequency f1 (for example, 30 to 200 MHz) in the flexural vibration is equal to the resonance frequency f2 of the disk resonators 31 and 31 (in a reverse phase), specifically, $0.8 \times f2 \leq f1 \leq 1.2 \times f2$. The metal films 16 and 16 serve as excitation electrodes 16$a$ of the vibration arm portions 14 and 14 and also serve as the first extraction electrode 16$b$1 and the second extraction electrode 16$b$2 for inputting/outputting an electric signal to/from the disk resonator 31, as described below.

Around the aforementioned opening 13 on the upper surface of the tuning fork type vibrating body 11, the metal films 16 and 16 are notched in an approximately rectangular shape to expose the piezoelectric thin film 15. In the portion where the piezoelectric thin film 15 is exposed, the electrode patterns 17 and 17 for adjusting the resonance frequencies of the disk resonators 31 and 31 are formed in the vibration arm portions 14 and 14, respectively. Each of the electrode patterns 17 and 17 is formed in an island shape such that a plurality of punctiform electrode films 18 made of for example, molybdenum are arranged in a row in a plurality of portions by interposing a gap area and are arranged to be horizontally symmetric with respect to the line extending in a forward-backward direction between the vibration arm portions 14 and 14. In this example, the electrode films 18 are formed to have the same dimension (such as a diameter and a height). Specifically, a diameter of the electrode film 18 may be set to, for example, 2 to 10 μm. The diameter of the electrode film 18 is set to 5 μm in this example. The interval between the neighboring electrode films 18 and 18 may be set to, for example, 5 to 30 μm. The interval between the neighboring electrode films 18 and 18 is set to 10 μm in this example.

Similar to the vibration arm portion 14, each of the base portions 12 and 12 includes a piezoelectric thin film 15 and metal films 16 and 16 formed on the upper and lower surfaces of the piezoelectric thin film 15. In the near-side base portion 12, the upper metal film 16 is integrated with the upper metal film 16 of the vibration an portion 14 and 14 so that they are connected to each other. Meanwhile, in the far-side base portion 12, the upper metal film 16 is electrically insulated from the upper metal film 16 of the vibration arm portions 14 and 14 by the gap area 19 formed in the near side of the base portion 12. Note that the lower metal film 16 of the base portion 12 is formed in a position closer to the center from the portion where the base portion 12 and the nitride film 4 make contact with each other in the longitudinal direction of the base portion 12 in order to extract the lower electrode.

In the upper metal films 16 and 16 of each base portion 12 and 12, the input/output ports 20 and 20 made of, for example, aluminum (Al) are respectively formed in order to input/output an electric signal between the vibrator and an external electronic apparatus. In addition, a contact hole 21 reaching the lower metal film 16 is formed in the piezoelectric thin film 15 of the far-side base portion 12 as illustrated in FIG. 4, and the far-side input/output port 20 is electrically connected to the lower metal film 16 through the inner side of the contact hole 21. The near-side input/output port 20 is connected to the upper metal film 16 and 16 of the vibration arm portion 14 and 14 through the upper metal film 16 of the piezoelectric thin film 15. Note that an insulation film 34 made of, for example, silicon oxide is formed in each of the far side and near side of the input/output port 20 and 20.

Each of the disk resonators 31 and 31 includes the piezoelectric thin film 15 having a diameter of, for example, 50 μm and a pair of excitation electrodes 32 and 32 formed to interpose the piezoelectric thin film 15 in a vertical direction (plate thickness direction). In these disk resonators 31 and 31, the piezoelectric thin films 15 and 15 of the disk resonators 31 and 31 are integrated with the piezoelectric thin film 15 of the tuning fork type vibrating body 11 (vibration arm portions 14 and 14). That is, if the right vibration arm portion 14 is referred to as one vibration arm portion 14, and the left vibration arm portion 14 is referred to as the other vibration arm portion 14 out of a pair of the vibration arm portions 14 and 14, one end of the support 33 horizontally extending to the right disk resonator 31 is connected to the longitudinal center in the right-side lateral face of one of the vibration portions 14, and the other end of the support 33 is connected to the outer circumference of the disk resonator 31.

The metal films 16 and 16 in one of the vibration arm portion 14 are connected to the excitation electrodes 32 and 32, respectively, in the right disk resonator 31 through the support 33. Similarly, the metal film 16 in the other vibration arm portion 14 is connected to the left disk resonator 31 through the support 33 provided in the longitudinal center of the other vibration arm portion 14. In this case, the vibrator including a pair of disk resonators 31 and 31 and the tuning fork type vibrating body 11 is vertically symmetric as seen on a top plan view, and the area floating over the nitride film 4 is approximately horizontally symmetric as seen in a thickness direction. Note that, although the metal film 16 and the excitation electrode 32 are formed as a single integrated body as described below, the reference signs are differently denoted for convenience purposes.

Since the aforementioned hollow portion 3 is formed to have a dimension larger than that of the disk resonator 31 and 31, each disk resonator 31 and 31 is supported by the tuning fork type vibrating body 11 while it floats over the base substrate 1, the oxide film 2, and the nitride film 4 as illustrated in FIG. 3. As a result, the disk resonators 31 and 31 are configured to generate contour vibration in which the piezoelectric thin film 15 expands and contracts in a radial direction in a circumferential direction by using the center of the disk resonators 31 and 31 as a nodal point. In this case, dimensions such as diameters of the disk resonators 31 and 31 are aligned such that the vibration is generated in phase. That is, when one of the disk resonators 31 expands, the other disk resonator 31 also expands. Similarly, when one of the disk resonators 31 contracts, the other disk resonator 31 also contracts.

Figure 5:
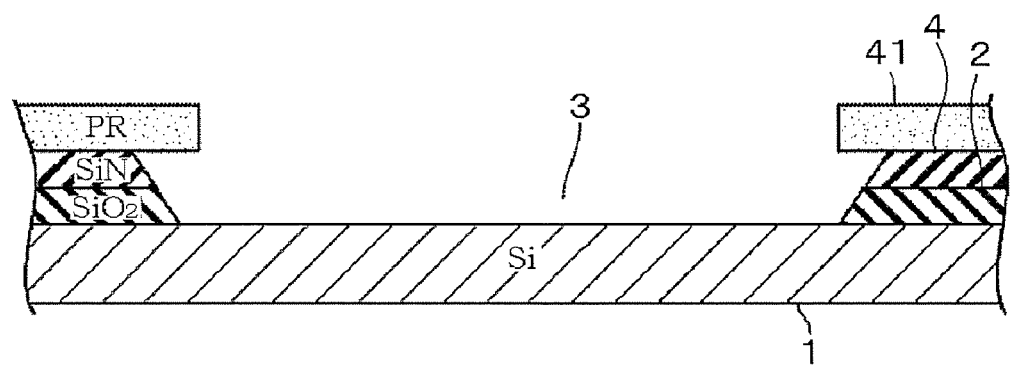
FIG. 5 is a vertical cross-sectional view illustrating a process of manufacturing the vibrator.
Figure 6:
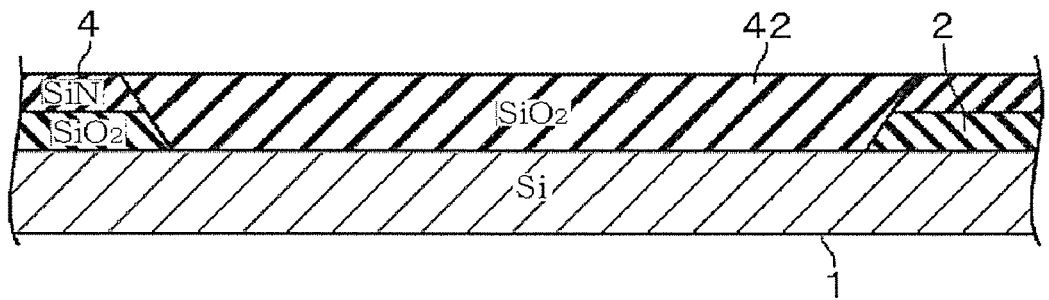
FIG. 6 is a vertical cross-sectional view illustrating a process of manufacturing the vibrator.
Figure 16:
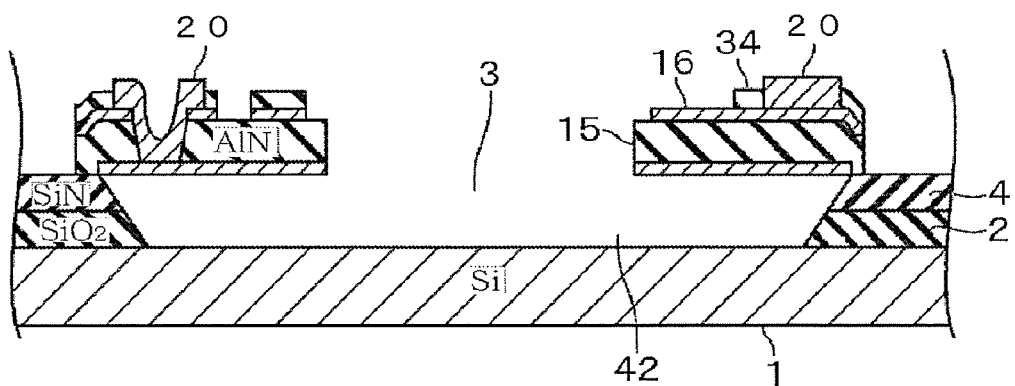
FIG. 16 is a vertical cross-sectional view illustrating a process of manufacturing the vibrator.
Figure 17:
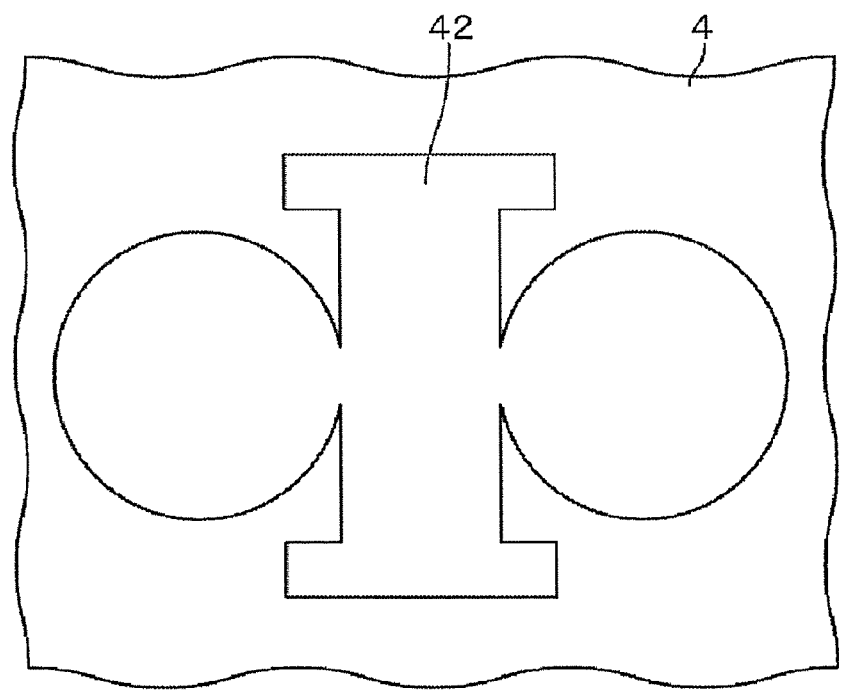
FIG. 17 is a top plan view illustrating a process of manufacturing the vibrator.

Subsequently, a method of manufacturing the vibrator will be described with reference to FIG. 5 to FIG. 20. First, the oxide film 2, the nitride film 4, and the photoresist mask 41 made of an organic material are sequentially stacked over the base substrate 1 from the bottom side in this order. Then, as illustrated in FIG. 5, a pattern corresponding to the hollow portion 3 is formed in the photoresist mask 41 through photolithography. Subsequently, the oxide film 2 and the nitride film 4 are wet-etched, for example, using a hydrofluoric acid aqueous solution and the like and the photoresist mask 41 as a mask to form the hollow portion 3. In addition, after the photoresist mask 41 peels off, a sacrifice film 42 made of, for example, silicon oxide is formed in the base substrate 1 to bury the hollow portion 3. Then, as illustrated in FIG. 6 and FIG. 17, the nitride film 4 and the sacrifice film 42 are flattened through chemical mechanical polishing (CMP).

Figure 7:
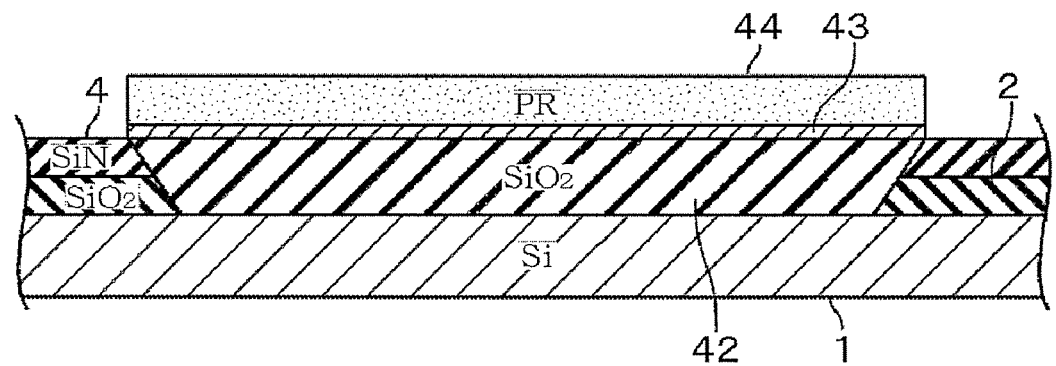
FIG. 7 is a vertical cross-sectional view illustrating a process of manufacturing the vibrator.
Figure 8:
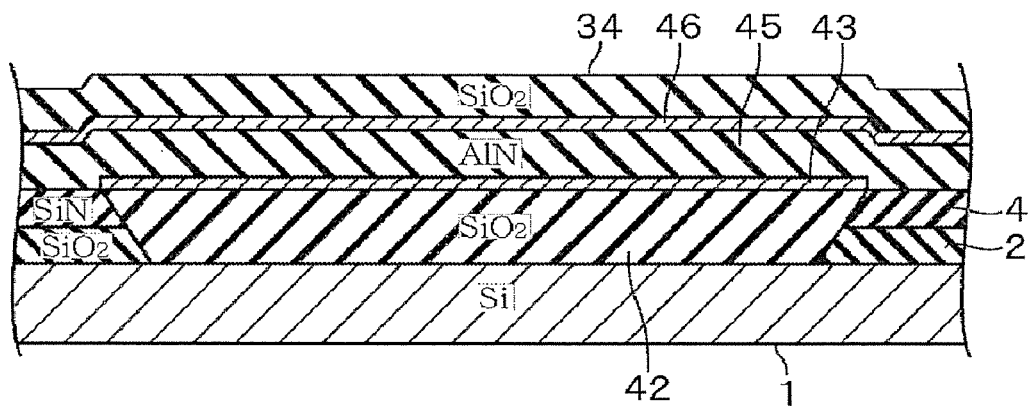
FIG. 8 is a vertical cross-sectional view illustrating a process of manufacturing the vibrator.
Figure 9:
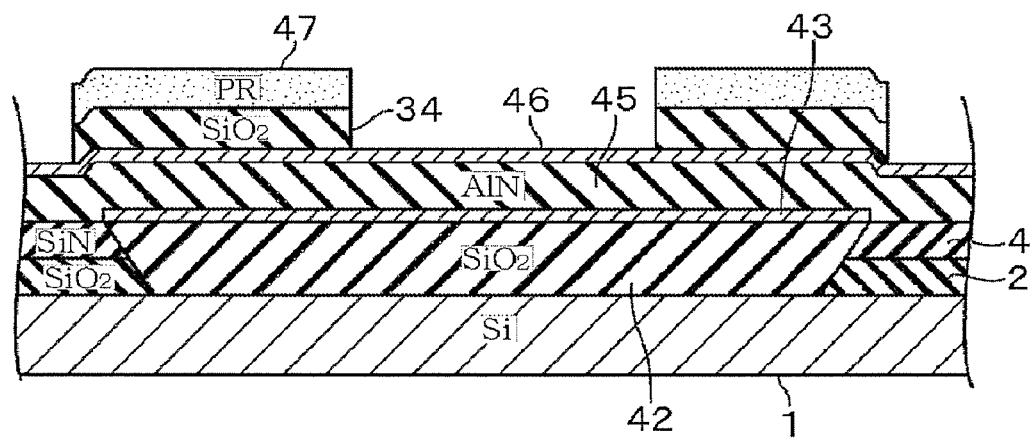
FIG. 9 is a vertical cross-sectional view illustrating a process of manufacturing the vibrator.

Then, the thin film 43 made of, for example, molybdenum and the photoresist mask 44 are sequentially stacked over the base substrate 1 (nitride film 4 and sacrifice film 42) from the bottom side in this order. Similarly, as illustrated in FIG. 7, a shape corresponding to the metal film 16 and the excitation electrode 32 is patterned on the thin film 43 through photolithography. Subsequently, as illustrated in FIG. 8, after the photoresist mask 44 peels off, for example, the piezoelectric layer 45 made of aluminum nitride, the thin film 46 made of molybdenum, and the insulation film 34 made of silicon oxide are sequentially stacked over the base substrate 1 from the bottom side in this order. As illustrated in FIG. 9, photolithography using the photoresist mask 47 is performed for the insulation film 34 to form a pattern corresponding to the metal film 16 and the excitation electrode 32.

Figure 10:
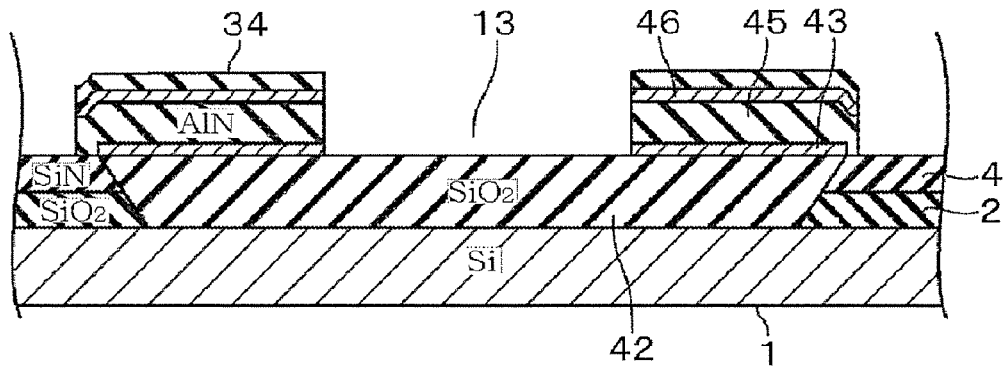
FIG. 10 is a vertical cross-sectional view illustrating a process of manufacturing the vibrator.
Figure 18:
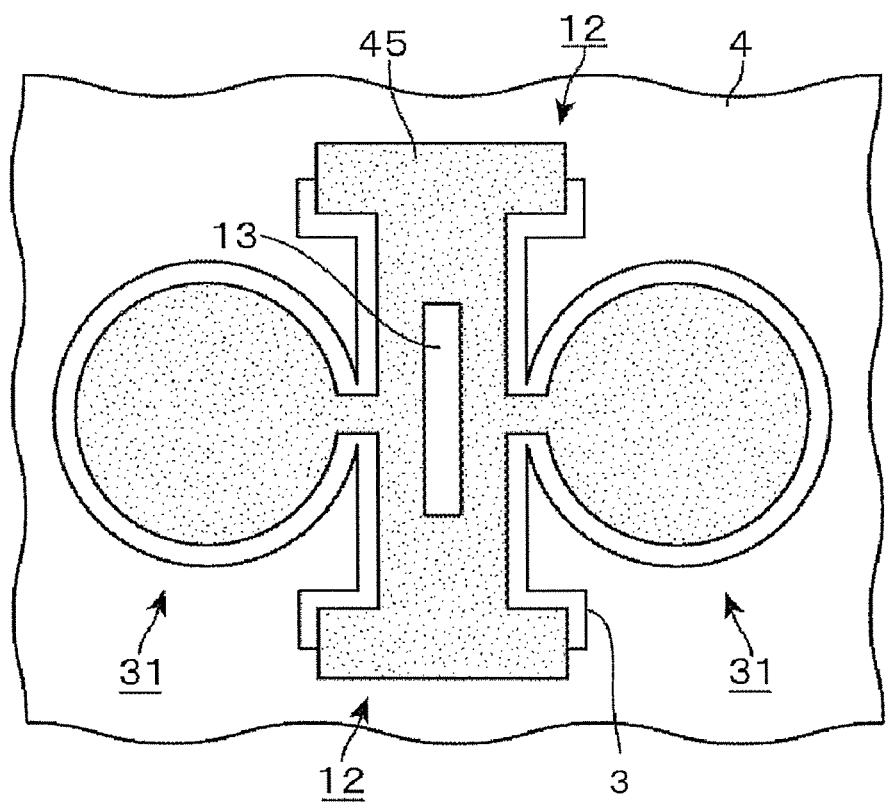
FIG. 18 is a top plan view illustrating a process of manufacturing the vibrator.

In addition, after the photoresist mask 47 peels off, the thin film 46, the piezoelectric layer 45, and the thin film 43 are dry-etched, for example, using plasma by interposing the insulation film 34 as illustrated in FIG. 10, so that a structure corresponding to the disk resonators 31 and 31 and the tuning fork type vibrating body 11 is formed as illustrated in FIG. 18. As a result, the disk resonators 31 and 31 are formed to have the piezoelectric thin film 15 vertically interposed between the excitation electrodes 32 and 32, and the tuning fork type vibrating body 11 is formed to have the piezoelectric thin film 15 vertically interposed between the metal films 16 and 16. Furthermore, an opening 13 is formed in the tuning fork type vibrating body 11. In this case, the thickness of the insulation film 34 is also reduced through the etching.

Figure 11:
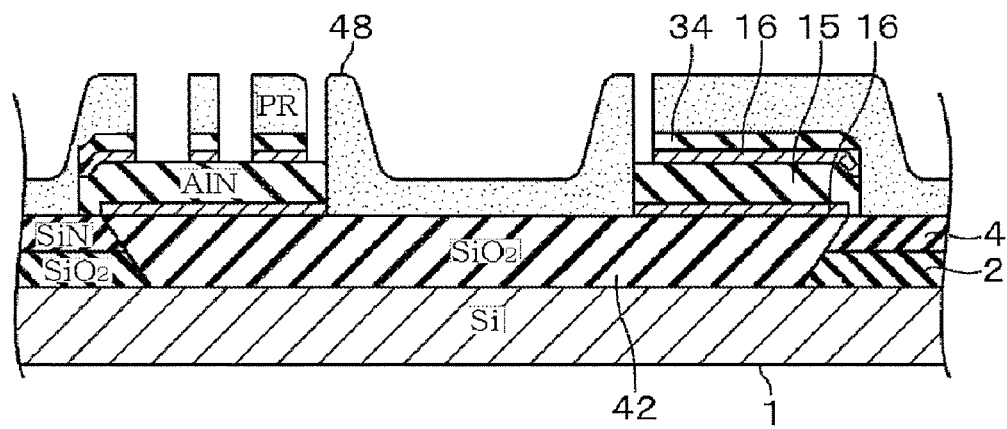
FIG. 11 is a vertical cross-sectional view illustrating a process of manufacturing the vibrator.
Figure 19:
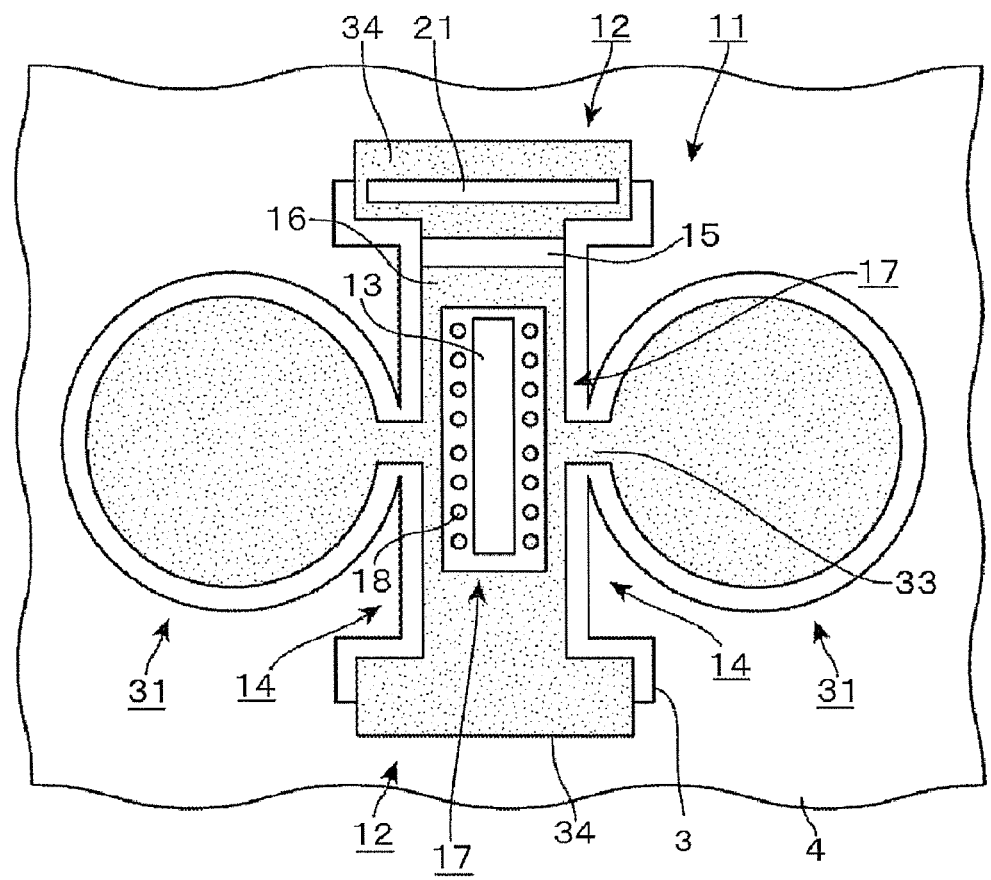
FIG. 19 is a top plan view illustrating a process of manufacturing the vibrator.

Then, the photoresist mask 48 is formed over the base substrate 1 to cover the structure. As illustrated in FIG. 11, the patterning is performed for the photoresist mask 48 such that the exposed face of the piezoelectric thin film 15 around the aforementioned contact hole 21, the gap area 19, and the opening 13 is opened, and the electrode pattern 17 is formed on the exposed face. In addition, if the insulation film 34 and the thin film 46 are etched using the photoresist mask 48, the piezoelectric thin film 15 is exposed in the area where the contact hole 21 is formed and the gap area 19 as illustrated in FIG. 11 and FIG. 19, and the electrode pattern 17 is formed at the same time. Note that the area where the insulation film 34 and the thin film 46 remain in the disk resonators 31 and 31 and the tuning fork type vibrating body 11 is hatched in FIG. 19.

Figure 12:
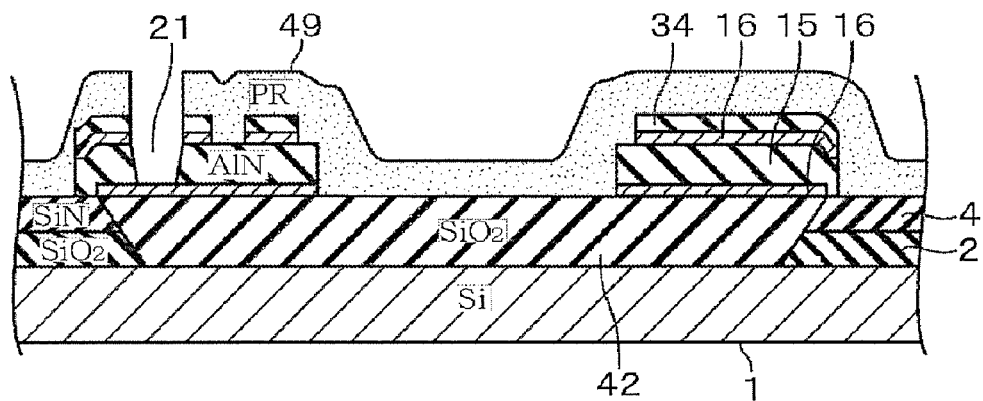
FIG. 12 is a vertical cross-sectional view illustrating a process of manufacturing the vibrator.
Figure 13:
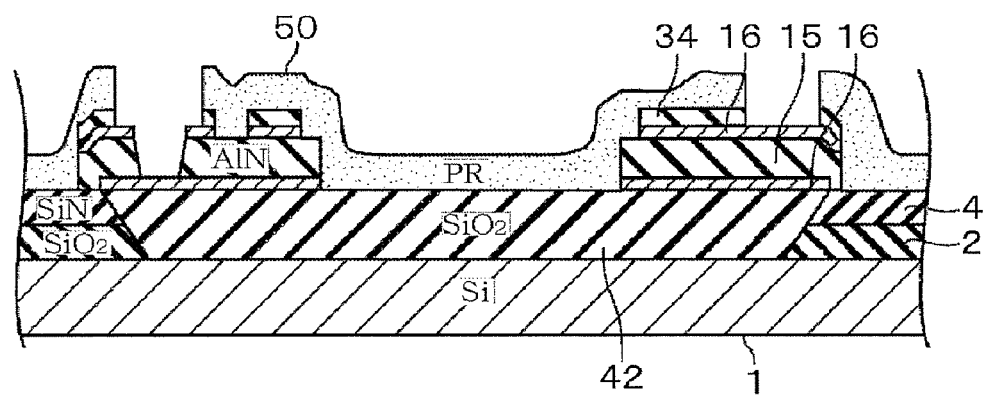
FIG. 13 is a vertical cross-sectional view illustrating a process of manufacturing the vibrator.
Figure 14:
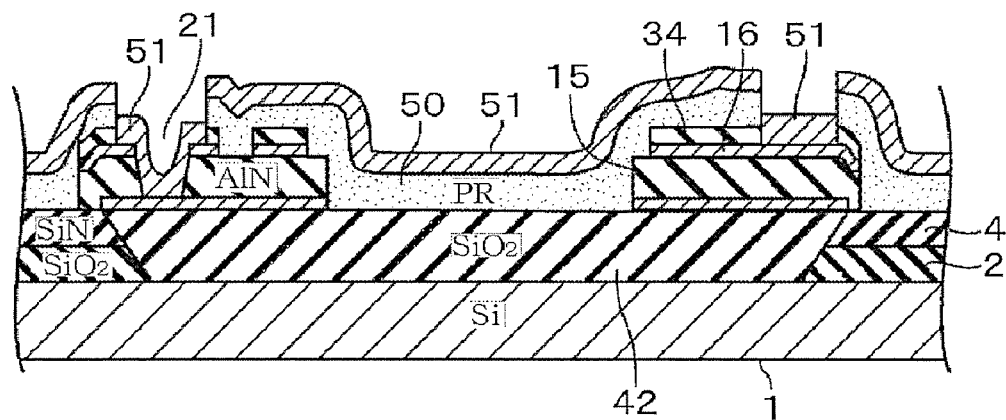
FIG. 14 is a vertical cross-sectional view illustrating a process of manufacturing the vibrator.

Subsequently, after the photoresist mask 48 peels off, the photoresist mask 49 is formed over the base substrate 1 such that only the area where the contact hole 21 is formed is opened as illustrated in FIG. 12, and the piezoelectric thin film 15 is etched by using the photoresist mask 49 as a mask. Then, the photoresist mask 49 peels off, and the photoresist mask 50 is formed such that only the area where the input/output ports 20 and 20 are formed is opened as illustrated in FIG. 13. The insulation film 34 is etched using the photoresist mask 50. In addition, when a conductive film 51 made of, for example, aluminum is formed on the base substrate 1 through sputtering and the like, the conductive film 51 is formed to cover the inside of the contact hole 21 and the upper surface of the photoresist mask 50 as illustrated in FIG. 14.

Figure 15:
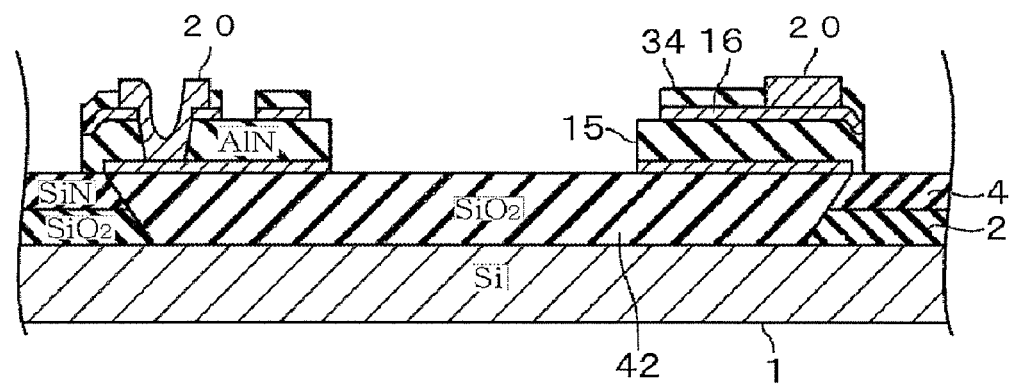
FIG. 15 is a vertical cross-sectional view illustrating a process of manufacturing the vibrator.

Then, the base substrate 1 is immersed, for example, in an organic solvent and the like, so that the photoresist mask 50 is dissolved by the organic solvent as illustrated in FIG. 15, and the excessive conductive film 51 formed on the photoresist mask 50 is removed along with the photoresist mask 50. Through this process, the input/output ports 20 and 20 are formed. Then, the photoresist mask (not illustrated) is formed over the base substrate 1 to cover, for example, the input/output ports 20 and 20 and the nitride film 4 and expose, for example, the internal area of the opening 13, and the base substrate 1 in this state is immersed, for example, in a hydrofluoric acid aqueous solution. The hydrofluoric acid aqueous solution flows into the sacrifice film 42 in the lower layer side of the vibrator, for example, through the internal area of the opening 13 to etch the sacrifice film 42. Therefore, as illustrated in FIG. 16, the center of the tuning fork type vibrating body 11 (other than the base portions 12 and 12) is separated from the base substrate 1, and the disk resonators 31 and 31 floats over the base substrate 1 across the entire surface as illustrated in FIG. 3 described above. Furthermore, through the etching, the insulation film 34 remaining in the upper surface of the electrode pattern 17 and the upper surface of the disk resonators 31 and 31 is removed.

Figure 20:
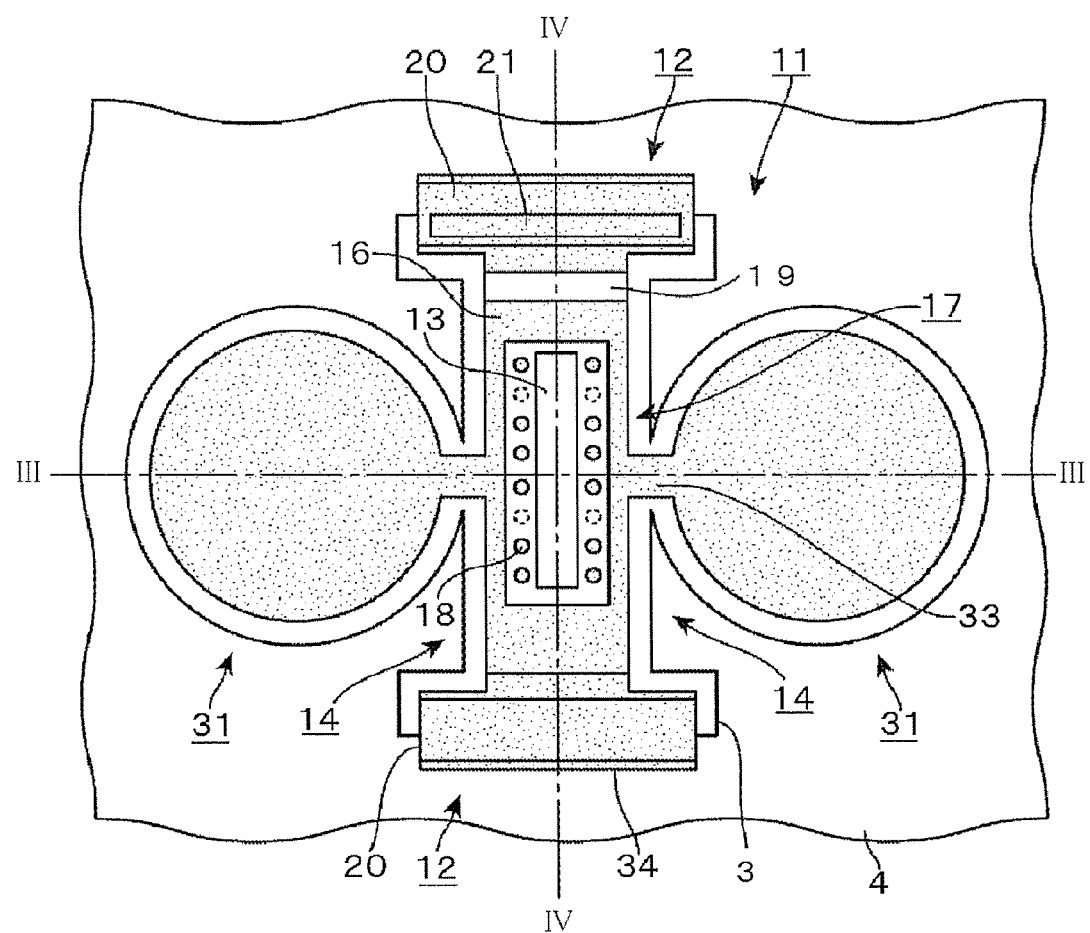
FIG. 20 is a top plan view illustrating a process of manufacturing the vibrator.

Subsequently, for example, when the resonance frequency of the vibrator is adjusted, a part of the electrode pattern 17 is removed (trimmed), for example, through laser processing. Specifically, the base substrate 1 is placed on a table (not illustrated), and laser light is irradiated onto the electrode film 18 of the electrode pattern 17 from a laser light irradiation unit (not illustrated) to dissolve and evaporate the electrode film 18. Then, in order to remove another electrode film 18, the laser light irradiation unit is moved relatively to the table, and laser light is irradiated similarly. In this case, the electrode film 18 is removed such that one of the vibration arm portions 14 is horizontally symmetric to the other vibration arm portion 14. FIG. 20 illustrates an example in which the second electrode films 18 and 18 from the far side and the sixth electrode films 18 and 18 from the far side are removed from each electrode pattern 17 of the vibration arm portions 14 and 14. As a result, the resonance frequency is equally changed (increases) while the vibration balance (resonance frequency) of the disk resonators 31 and 31 is kept by removing the electrode films 18 and 18 in a state that the electrode patterns 17 and 17 of the vibration arm portions 14 and 14 are horizontally symmetric to each other.

Here, in a case where the portion connecting the disk resonators 31 and 31 is not the tuning fork type vibrating body 11, that is, for example, if the connecting portion 90 of FIG. 24 described below is used instead of the tuning fork type vibrating body 11, the resonance frequencies of the disk resonators 31 and 31 are not changed even by trimming the electrode film 18 on the connecting portion 90. Meanwhile, in a case where the tuning fork type vibrating body 11 that vibrates in the same way as vibration of the disk resonators 31 and 31 is provided between the disk resonators 31 and 31, the resonance frequency of the tuning fork type vibrating body 11 is changed by trimming the electrode film 18 of the tuning fork type vibrating body 11, and the resonance frequencies of the disk resonators 31 and 31 are changed. A fact that the resonance frequencies of the disk resonators 31 and 31 are changed along with the change of the resonance frequency of the tuning fork type vibrating body 11 in this manner was identified through simulation separately performed by variously changing the lengths of the vibration arm portions 14 and 14, which is not described in detail herein.

For example, as an electric signal is externally input to the vibrator formed in this manner through the input/output ports 20 and 20, the disk resonators 31 and 31 and the tuning fork type vibrating body 11 vibrate at respective resonance frequencies, and the electric signal based on the vibration is output through the input/output ports 20 and 20. Specifically, for example, contour vibration caused by expansion and contraction in a radial direction is generated in the disk resonators 31 and 31 along the circumferential direction. In addition, flexural vibration is generated in the tuning fork type vibrating body 11 such that the vibration arm portions 14 and 14 approach or get apart from each other.

Figure 21:
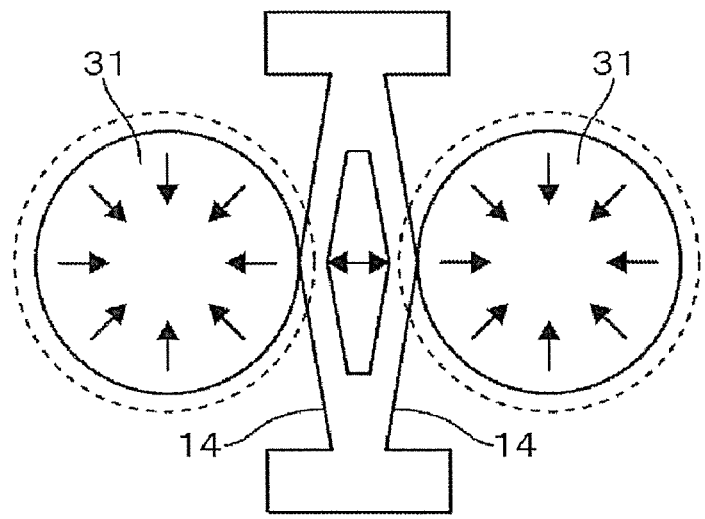
FIG. 21 is a schematic diagram illustrating a vibration state of the vibrator.
Figure 22:
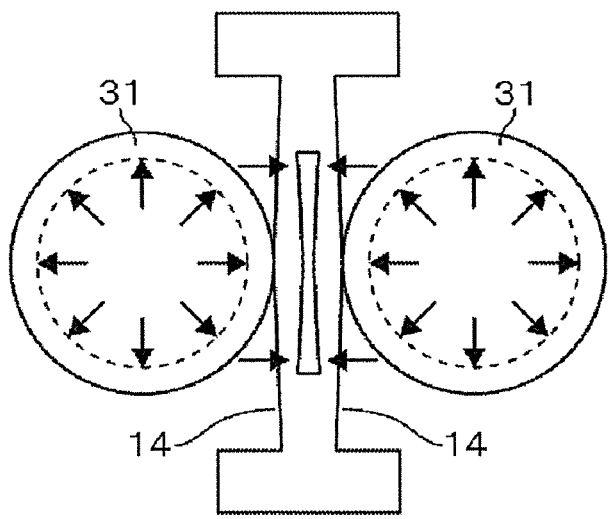
FIG. 22 is a schematic diagram illustrating a vibration state of the vibrator.

In this case, the contour vibration is generated from the disk resonators 31 and 31 in phase because the diameter and the like of the piezoelectric thin film 15 are aligned. In addition, in the tuning fork type vibrating body 11, each dimension is adjusted to generate the flexural vibration at the same frequency as that of the disk resonators 31 and 31, and further, the upper metal film 16 of the tuning fork type vibrating body 11 is connected to the excitation electrode 32 in the upper surface side of the disk resonators 31 and 31. Furthermore, the lower metal film 16 of the tuning fork type vibrating body 11 is connected to the excitation electrode 32 in the lower surface of the disk resonators 31 and 31. For this reason, the flexural vibration is generated in the tuning fork type vibrating body 11 in reverse phase to vibration of the disk resonators 31 and 31. Therefore, the vibration arm portions 14 and 14 generate the flexural vibration to be separated from each other when the disk resonators 31 and 31 contract as illustrated in FIG. 21, whereas the vibration arm portions 14 and 14 generate the flexural vibration to approach each other when the disk resonators 31 and 31 expands as illustrated in FIG. 22. In this manner, the flexural vibration is generated in the tuning fork type vibrating body 11 such that vibration caused by the expansion and contraction of the disk resonators 31 and 31 is absorbed, that is, each of the center positions of the disk resonators 31 and 31 is not deviated by the contour vibration. Note that vibration generated in the tuning fork type vibrating body 11 and the disk resonators 31 and 31 is illustrated exaggeratively in FIG. 21 and FIG. 22.

Figure 23:
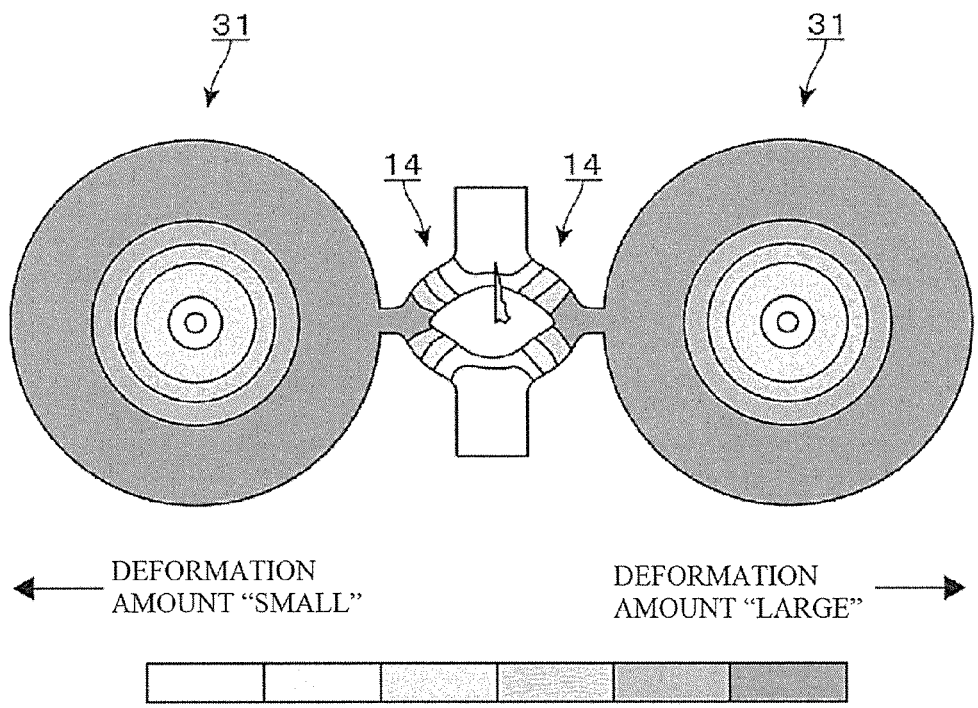
FIG. 23 is a characteristic diagram illustrating a simulation result obtained from the vibrator.

Here, a result of the simulation analysis performed for the vibration mode of the vibrator according to this disclosure is illustrated in FIG. 23. Since the tuning fork type vibrating body 11 is vibrated (deformed) in addition to the disk resonators 31 and 31, a nodal point (area having a small deformation amount) is formed in the center of each of the disk resonators 31 and 31, and the deformation amount increases as close to the outer circumference, so that an ideal vibration mode in which a uniform deformation amount is obtained along the circumferential direction is implemented in each of the disk resonators 31 and 31. In this configuration, it is recognized that the energy of the disk resonators 31 and 31 does not leak, or the leakage is suppressed using the tuning fork type vibrating body 11.

Figure 24:
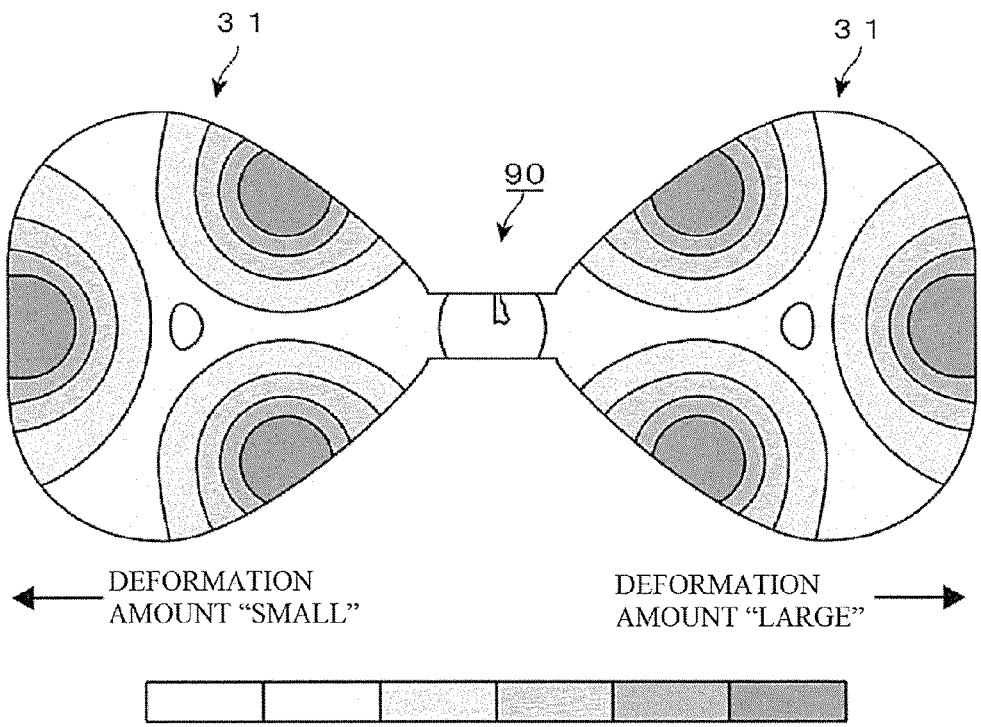
FIG. 24 is a characteristic diagram illustrating a simulation result obtained from the vibrator.

Meanwhile, for example, when a rectangular connecting portion 90 is provided between the disk resonators 31 and 31 instead of the tuning fork type vibrating body 11, the nodal point is formed in an approximate center of the disk resonators 31 and 31 as illustrated in FIG. 24. However, the deformation amount is not uniform along the radial direction and the circumferential direction. Therefore, in FIG. 24, it is recognized that the energy of the disk resonators 31 and 31 leaks through the connecting portion 90, and the Q-value is deteriorated compared to the case of FIG. 23.

Japanese Patent Application No. 2008-124747 discloses that the vibration vibrates in a radial extension mode where the center of the vibration serves as a nodal point. However, the inventors found that the following fact using numerical analysis. Connection and support with a connecting portion in a box shape generates a higher-order vibration mode where a plurality of nodal points are generated in the outer periphery, which is not ideal vibration mode. In this vibration mode, leakage and the like may cause deterioration of the electric characteristic. In contrast, in this embodiment, forming the vibration arm portions at the support eliminates influence by this support. This ensures ideal vibration along the circumferential direction, which is not achieved by the related art. In the ideal vibration, the vibration plate expands and contracts in a radial direction using the center of the vibration plate as a nodal point.

Figure 25:
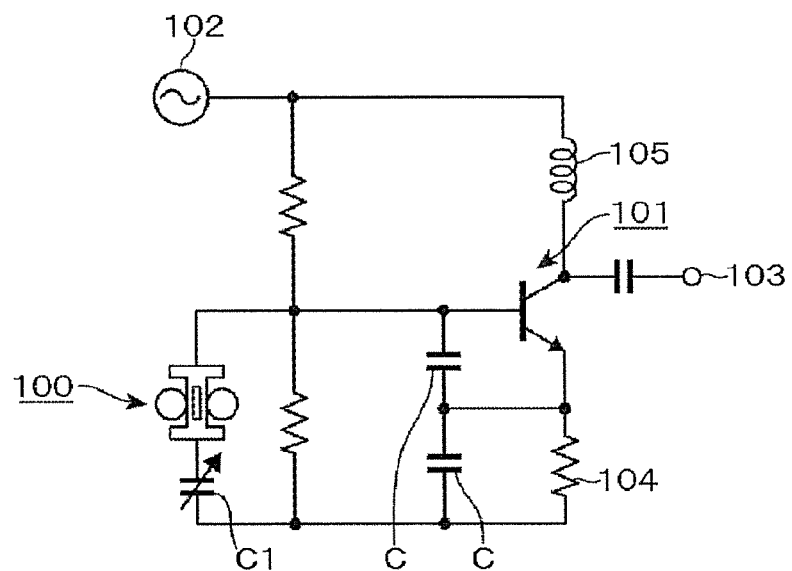
FIG. 25 is a schematic diagram illustrating an electric circuit in which the vibrator is employed.

Description will be made in brief with reference to FIG. 25 for an example of an electric circuit of an electric component (oscillator) obtained by assembling the vibrator according to this disclosure described above with an oscillation circuit. FIG. 25 illustrates an example of a Colpitts circuit including a transistor 101 and a pair of capacitors C and C connected in series. A series circuit including the vibrator 100 disclosed herein and a variable capacitor C1 is connected to a base terminal of the transistor 101. A power supply 102 is connected to a node between the base terminal and the vibrator 100, and an output port 103 for outputting the electric signal is connected to a collector terminal of the transistor 101. In FIG. 25, the reference numeral 104 denotes resistance, and the reference numeral 105 denotes an inductance.

According to the embodiment described above, the tuning fork type vibrating body 11 is interposed between the disk resonators 31 and 31 which generate contour vibration in phase, and the disk resonators 31 and 31 are connected to the vibration arm portions 14 and 14, respectively, of the tuning fork type vibrating body 11. In addition, the tuning fork type vibrating body 11 is vibrated in reverse phase to vibration of the disk resonators 31 and 31 to absorb expansion and contraction of the disk resonators 31 and 31. For this reason, it is possible to suppress hindrance of vibration in each of the disk resonators 31 and 31. That is, it is possible to suppress the energy of the disk resonators 31 and 31 from leaking through the tuning fork type vibrating body 11 and suppress deterioration of the electric characteristic.

In this manner, according to this disclosure, the connecting portion used to connect a pair of disk resonators 31 and 31 and supported by the base substrate 1 also serves as a vibrating body which vibrates in reverse phase to vibration of the disk resonators 31 and 31. Meanwhile, in the related art, since no attention has been given to a function of the connecting portion as a vibrating body, there has been no study for the shape, the dimension, and the like of the connecting portion. That is, since the connecting portion has a dimension significantly smaller than that of the disk resonator in the configuration disclosed in Japanese Patent Application No. 2008-124747 described in the paragraphs of Background, the connecting portion generates a frequency significantly higher than the resonance frequency of the disk resonator even when the connecting portion vibrates. For this reason, vibration of the connecting portion is negligible compared to vibration of the disk resonator.

In contrast, according to this disclosure, the connecting portion between the disk resonators 31 and 31 is configured using the tuning fork type vibrating body 11 to vibrate in reverse phase to vibration of the disk resonators 31 and 31 as described above. In this case, flexural vibration has a resonance frequency lower than that of the aforementioned contour vibration even when the vibration body (tuning fork type vibrating body 11 or disk resonator 31) has the same dimension. In other words, when the tuning fork type vibrating body 11 is vibrated at the same frequency as that of the disk resonator 31, the tuning fork type vibrating body 11 is finished to have a dimension smaller than that of the disk resonator 31. For this reason, when the tuning fork type vibrating body 11 is vibrated at the same frequency as that of the disk resonators 31 and 31 in reverse phase, it is not necessary to increase a dimension of the tuning fork type vibrating body 11 to be substantially equal to that of the disk resonator 31. Therefore, it is possible to suppress a dimension of the vibrator from increasing and suppress deterioration of the electric characteristic.

Since the electrode pattern 17 is formed in each of the vibration arm portions 14 and 14, it is possible to adjust the resonance frequency of the vibrator using the electrode pattern 17 without processing the disk resonators 31 and 31. In this case, the electrode pattern 17 is fanned to be horizontally symmetric between the vibration arm portions 14 and 14 and trimming is performed to be horizontally symmetric. Therefore, it is possible to adjust the resonance frequency while the vibration balance between the disk resonators 31 and 31 is kept. Furthermore, since the neighboring electrode films 18 and 18 are separated from each other, it is possible to prevent laser light from being irradiated onto one electrode film 18 when the laser light is irradiated onto the other electrode film 18 even in a case where a processing position, a processing amount, or the like for laser processing (such as a relative movement distance of the laser light irradiation unit to the table described above or a laser light irradiation time) is deviated. Therefore, since it is possible to suppress a deviation of the resonance frequency between the disk resonators 31 and 31 when the trimming is performed for the electrode film 18, it is possible to prevent degradation of the Q-value. In addition, since the electrode pattern 17 is provided separately (electrically insulated) from the metal film 16, an adverse effect such as increase of the electric resistance of the disk resonator 31 or the tuning fork type vibrating body 11 does not occur even when the electrode pattern 17 is removed. Moreover, since the base portions 12 and 12 are provided in both sides of the vibration arm portions 14 and 14, it is possible to robustly hold the vibration arm portions 14 and 14 against the base substrate 1 when the vibration arm portions 14 and 14 vibrate.

Figure 26:
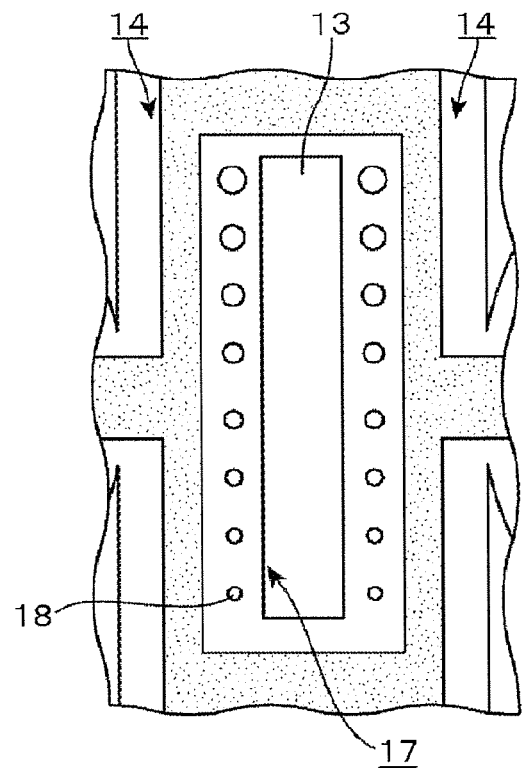
FIG. 26 is a partially enlarged top plan view illustrating another example of the vibrator.

Although the electrode films 18 are formed to have the same dimension in the example described above, for example, electrode films 18 having different dimensions may be arranged in the electrode patterns 17 and 17 as illustrated in FIG. 26. FIG. 26 illustrates an example in which a diameter of each electrode film 18 is gradually reduced from the far side to the near side, for example, across a range between 2 to 10 μm. If the electrode films 18 have different dimensions in this manner, it is possible to change the adjustment range of the resonance frequency of the disk resonator 31, for example, for each of the removed electrode film 18. Therefore, it is possible to perform frequency adjustment more conveniently. Even in this example, the left and right electrode patterns 17 and 17 are formed to be horizontally symmetric.

Although the electrode patterns 17 and 17 are arranged such that vibration arm portions 14 and 14 are horizontally symmetric, they may be horizontally asymmetric. Even in this case, when the electrode film 18 is removed, adjustment is performed to align the resonance frequency between the left and right disk resonators 31 and 31.

Figure 27:
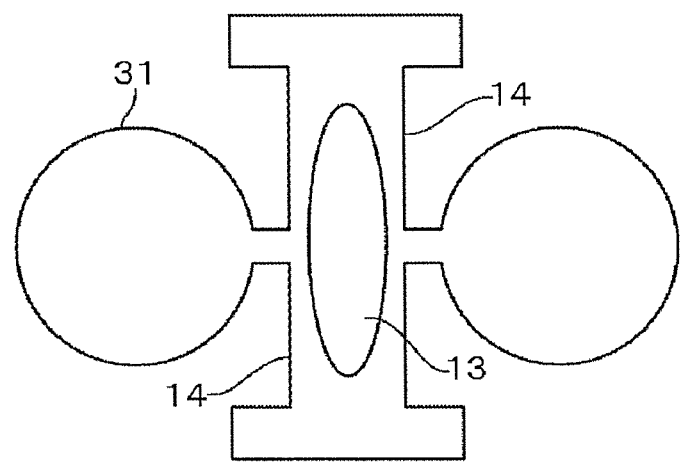
FIG. 27 is a top plan view illustrating another example of the vibrator.
Figure 28:
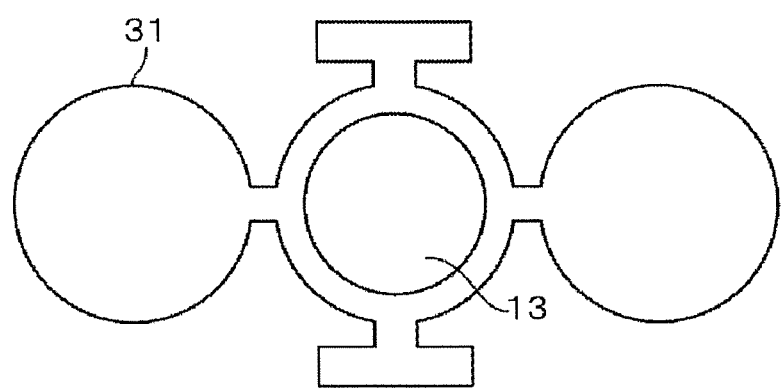
FIG. 28 is a top plan view illustrating another example of the vibrator.
Figure 29:
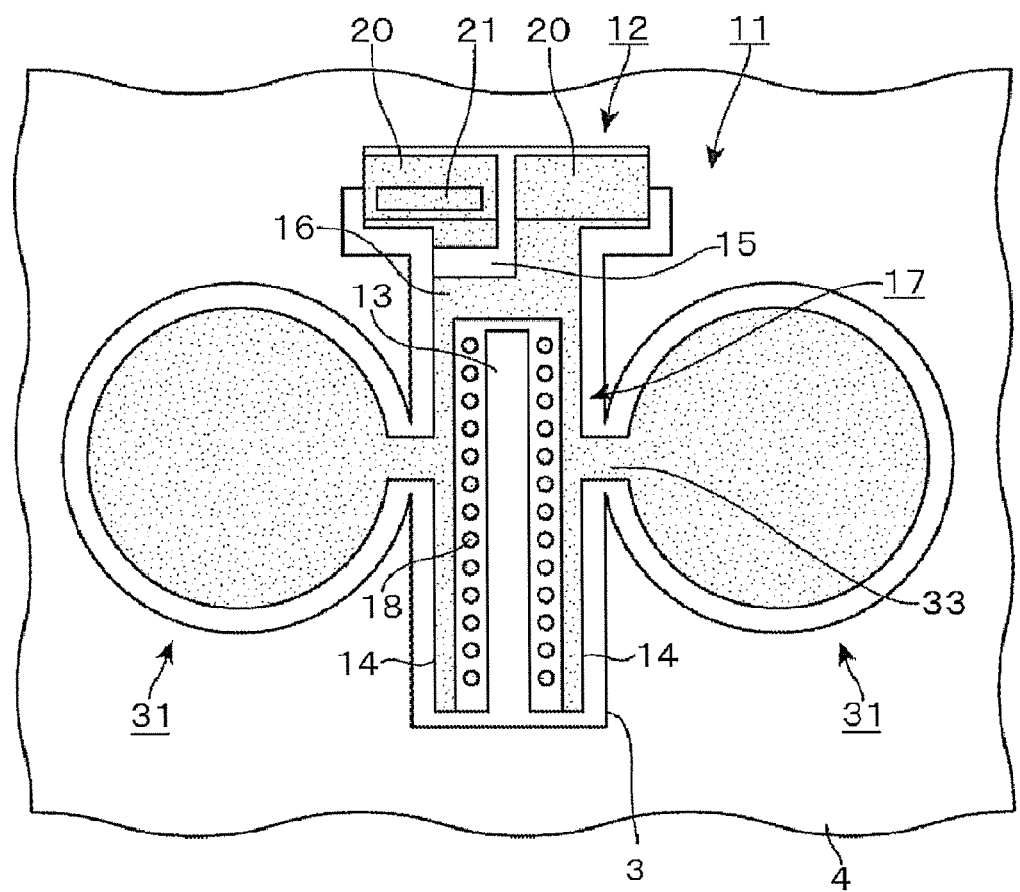
FIG. 29 is a top plan view illustrating another example of the vibrator.

In addition, any configuration of the tuning fork type vibrating body 11 may be employed if it can generate vibration in reverse phase to vibration of the disk resonators 31 and 31. For example, as illustrated in FIG. 27, the opening 13 may be formed in an approximately elliptical shape, and the vibration arm portions 14 and 14 may be narrowed gradually toward the center side (support 33) from the base portions 12 and 12. In addition, as illustrated in FIG. 28, the opening 13 may be formed in an approximately circular shape, and the vibration alum portions 14 and 14 may be formed in an approximately arc shape along the circumference of the opening 13. Furthermore, as illustrated in FIG. 29, for example, each of the vibration arm portions 14 and 14 may be supported by the far-side base portion 12 using a so-called cantilevered structure without providing the near-side base portion 12. In this case, in the far-side base portion 12, for example, a contact hole 21 is formed in the left side, and an input/output port 20 connected to the metal film 16 extending from the upper surface of the tuning fork type vibrating body 11 is arranged to adjoin the input/output port 20 provided in the contact hole 21 by interposing a gap area in the right side. Note that FIG. 27 and FIG. 28 illustrate simplified vibrators.

Figure 30:
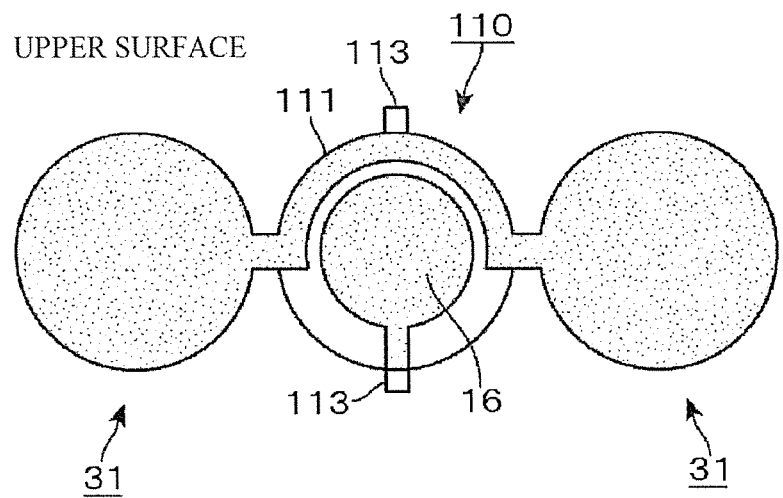
FIG. 30 is a top plan view illustrating another example of the vibrator.
Figure 31:
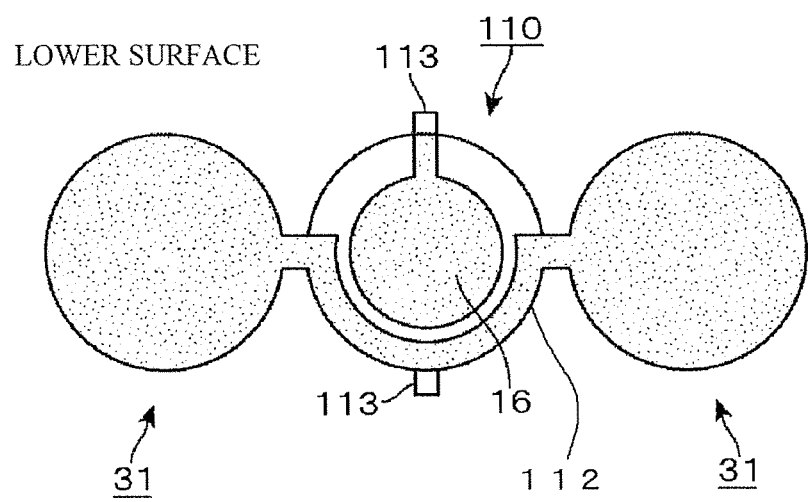
FIG. 31 is a top plan view illustrating the vibrator according to another example.

In addition, the disk resonator 110 may be provided instead of the tuning fork type vibrating body 11 used to connect the disk resonators 31 and 31. FIG. 30 and FIG. 31 illustrate such an example, in which the center disk resonator 110 is vibrated in reverse phase to vibration of the disk resonators 31 and 31 in both sides at the same frequency. Specifically, three disk resonators 31, 31, and 110 are formed such that diameters and the like are aligned with each other. In the centers of the upper and lower surfaces of the disk resonator 110, the excitation electrode (metal film 16) having an approximately circular shape is respectively formed to vibrate the disk resonator 110. In addition, an arc-shaped extraction electrode 111 connected to each of the excitation electrodes 32 and 32 of the upper surface of the left and right disk resonators 31 and 31 is formed in the outer circumference in the upper surface of the disk resonator 110 separately from the metal film 16. The metal film 16 and the extraction electrode 111 are connected to the electrode extraction portions 113 and 113, respectively, formed in each of the near side and the far side of the disk resonator 110.

An arc-shaped extraction electrode 112 is formed in the circumferential portion in the lower surface of the disk resonator 110. The arc-shaped extraction electrode 112 is connected to each of the excitation electrodes 32 and 32 of the lower surface side of the left and right disk resonators 31 and 31 and is arranged separately from the metal film 16 of the lower surface. The metal film 16 and the extraction electrode 112 are connected to the electrode extraction portions 113 and 113, respectively. As a result, the metal film 16 and the extraction electrode 111 in the upper surface side of the disk resonator 110 and the metal film 16 and the extraction electrode 112 in the lower surface side of the disk resonator 110 are wired as illustrated in FIG. 1 described above, so that the disk resonator 110 is vibrated in reverse phase to vibration caused by expansion and contraction of the disk resonators 31 and 31. The metal films 16 and 16 of the disk resonator 110 serve as the input/output ports 20 and 20, respectively.

In a position corresponding to a nodal point of the contour vibration in the center of the lower surface of the disk resonator 110, the disk resonator 110 is supported by the base substrate 1, and an electric signal is input/output through the extraction portion 113 described above. Although the disk resonator 110 has a circular shape in this example, it may have a triangular or rectangular shape. Similarly, the left and right disk resonators 31 and 31 may have a triangular or rectangular shape.

Although in the aforementioned example, a process of forming the upper metal film 16 and the excitation electrode 32 (process of forming the thin film 46) in the disk resonators 31 and 31 and the tuning fork type vibrating body 11 is used to form the electrode pattern 17, the electrode pattern 17 may be formed of aluminum by patterning the photoresist mask 50 in the process of forming the input/output ports 20 and 20 (process of forming the conductive film 51) such that a surrounding of an area of the electrode pattern 17 is opened. Alternatively, the electrode pattern 17 may be individually formed using the photoresist mask for the electrode pattern 17 after series of processes are terminated.

In the tuning fork type vibrating body 11, the metal film 16 is shared by the excitation electrode 16a for vibrating the tuning fork type vibrating body 11 and the first extraction electrode 16b1 and the second extraction electrode 16b2 which connect the excitation electrode 32 of the disk resonator 31 and 31 and the input/output port 20. However, the excitation electrode and the extraction electrode may be separately arranged. In this case, the excitation electrodes may be formed on the upper and lower surface of the vibration arm portions 14 and 14, and the extraction electrode may be formed in, for example, the lateral side and the like. Although the vibrator disclosed herein is integrated with the oscillation circuit in the example described above, the vibrator may be used a filter (electronic component). In this case, the electric signal input to the input/output port 20 is output from the input/output port 20 after electric signals unnecessary in the vibrator are removed.

Second Embodiment

Figure 32:
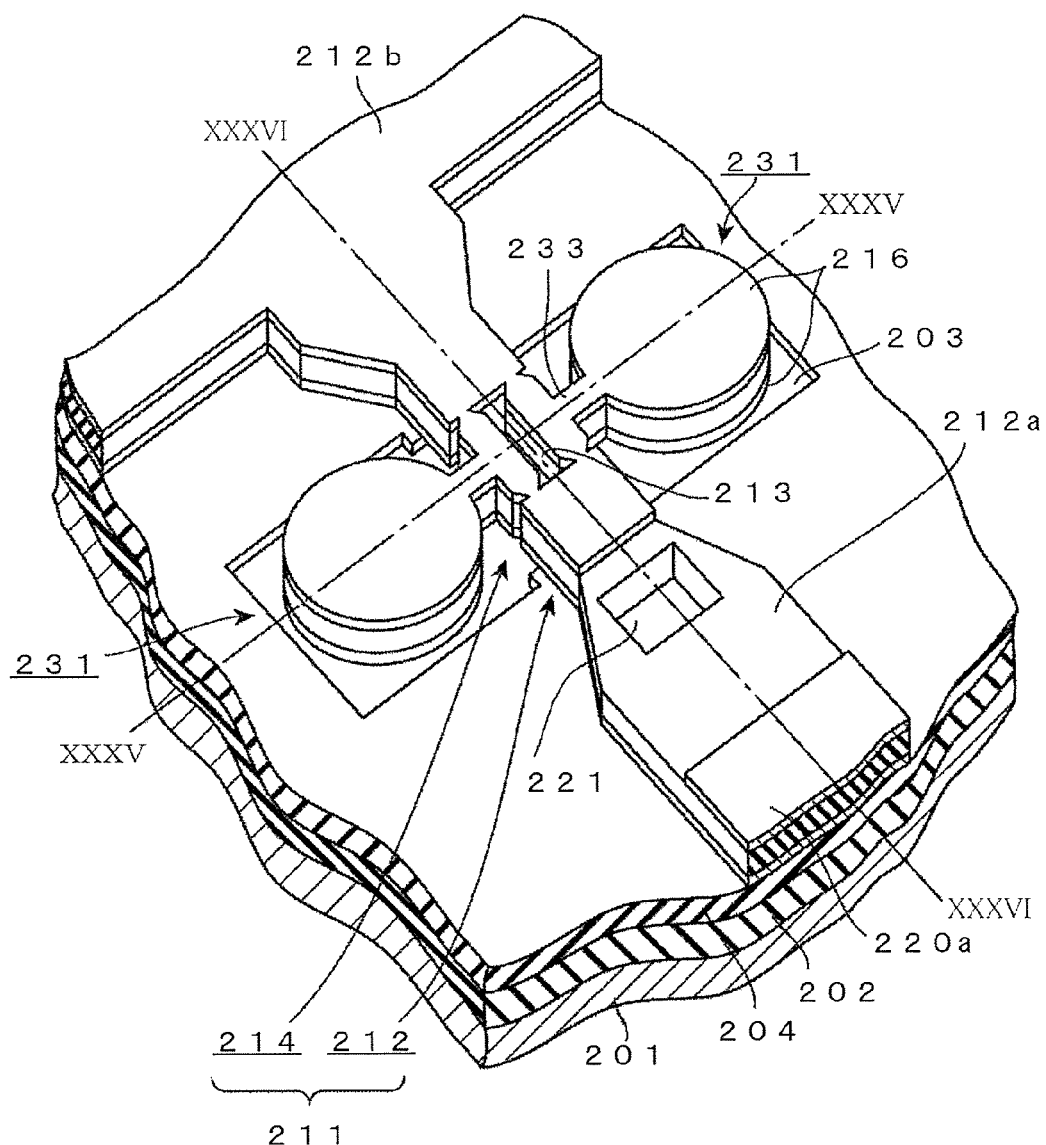
FIG. 32 is a perspective view illustrating an example of a vibrator according to a second embodiment of this disclosure.
Figure 35:
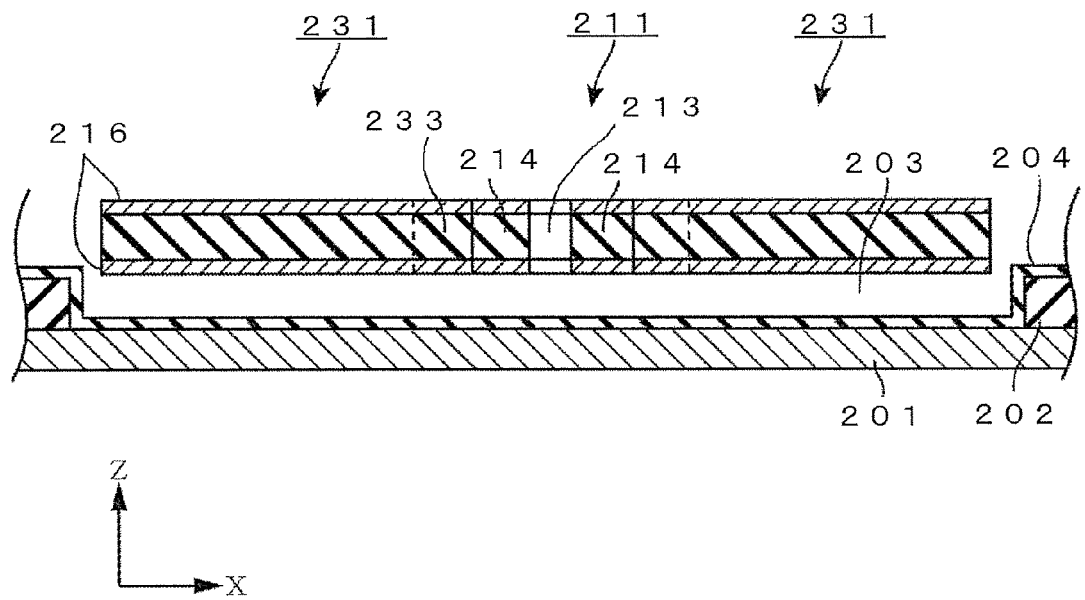
FIG. 35 is a vertical cross-sectional view illustrating the vibrator.
Figure 36:
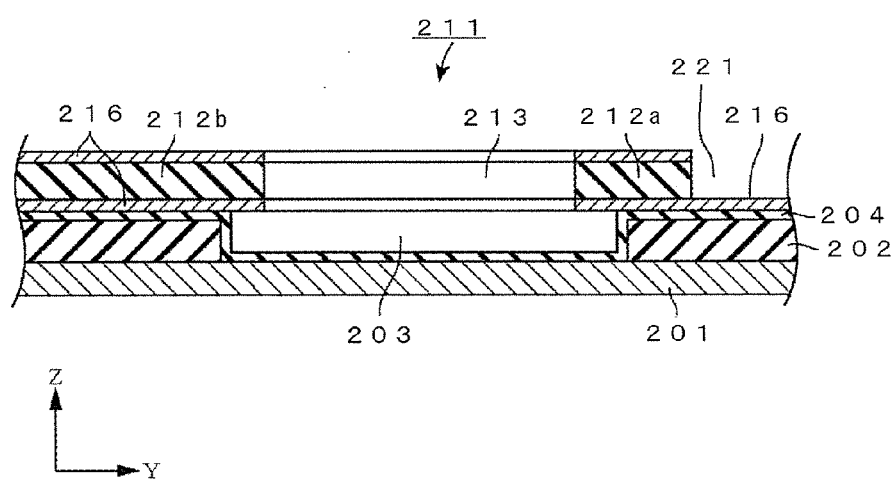
FIG. 36 is a vertical cross-sectional view illustrating the vibrator.

An example of the vibrator according to a second embodiment of this disclosure will be described with reference to FIG. 32 to FIG. 36. The vibrator is provided over a base substrate 201 made of, for example, silicon (Si) and the like. As illustrated in FIG. 32, the vibrator includes a tuning fork type vibrating body 211 supported by the base substrate 201 (specifically, nitride film 204 described below) and disk-shaped vibration bodies 231 and 231 which are connected to both left and right sides (X direction in FIG. 32) of the tuning fork type vibrating body 211. The vibrating bodies 231 and 231 are supported by the tuning fork type vibrating body 211 so as to float over the base substrate 201, as illustrated in FIG. 35 and FIG. 36. In addition, as described below, this vibrator is configured such that contour vibration is not hindered by the tuning fork type vibrating body 211, or leakage of the energy to the base substrate 201 side via the tuning fork type vibrating body 211 is suppressed when the contour vibration caused by expansion and contraction between the center and the outer circumference along the circumferential direction in each of vibrating bodies 231 and 231 is generated. Hereinafter, the tuning fork type vibrating body 211 and the vibrating bodies 231 and 231 will be described in detail. Note that FIG. 35 and FIG. 36 illustrate vertical cross sections obtained by cutting the vibrator along lines XXXV-XXXV and XXXVI-XXXVI of FIG. 32, respectively. In FIG. 32 to FIG. 36, the base substrate 201 is illustrated as being partially cut away.

Over the base substrate 201, an oxide film 202 made of, for example, silicon oxide and the like and a nitride film 204 made of, for example, silicon nitride and the like are sequentially stacked from the down side in this order. The aforementioned tuning fork type vibrating body 211 is supported (fixed) on the nitride film 204 such that the center in the longitudinal direction (Y direction in FIG. 33A) floats over the oxide film 202 and the nitride film 204. That is, a hollow portion 203 having a rectangular shape approximately larger than that of the vibrator is formed in the oxide film 202 and the nitride film 204. As illustrated in FIG. 36, one end side and the other end side of the tuning fork type vibrating body 211 in the longitudinal direction extend to the far side and the near side, respectively, from the hollow portion 203, and these extending portions are fixed on the nitride film 204 as base portions 212 and 212.

The near-side base portion and the far-side base portion of these base portions 212 and 212 in FIG. 32 are respectively denoted by "212a" and "212b", and the near-side and far-side base portions 212a and 212b have surfaces where respective input/output ports 220a and 220b are formed to input/output an electric signal to the tuning fork type vibrating body 211 and the vibrating bodies 231 and 231. Specifically, the near-side base portion 212a extends from the tuning fork type vibrating body 211 toward the near side so as to expand its diameter in a trapezoidal shape on a top plan view. Then, the portion with the expanded diameter includes an opening 221 where a metal film 216 that is integrally formed at a lower surface side of the vibrating bodies 211, 231, and 231 and the base portions 212a and 212b as described below is exposed. The base portion 212a in a near-side position separated from the opening 221 has a surface where the aforementioned input/output port 220a that is constituted of a metal film is formed. Then, the metal film 216 exposed on the bottom surface of the opening 221 and the input/output port 220a are electrically conductive, for example, by forming a metal film (not illustrated) through a mask after a sequence of processes for manufacturing the vibrator. Note that the input/output port 220a is integrated with the metal film 216 that is formed on the surfaces of the vibrating bodies 211, 231, and 231 and the base portions 212a and 212b, and then electrically insulated from the metal film 216 on the surface of the vibrating body 211 by removing the metal film 216 between the base portion 212a and the input/output port 220a.

Figure 33A:
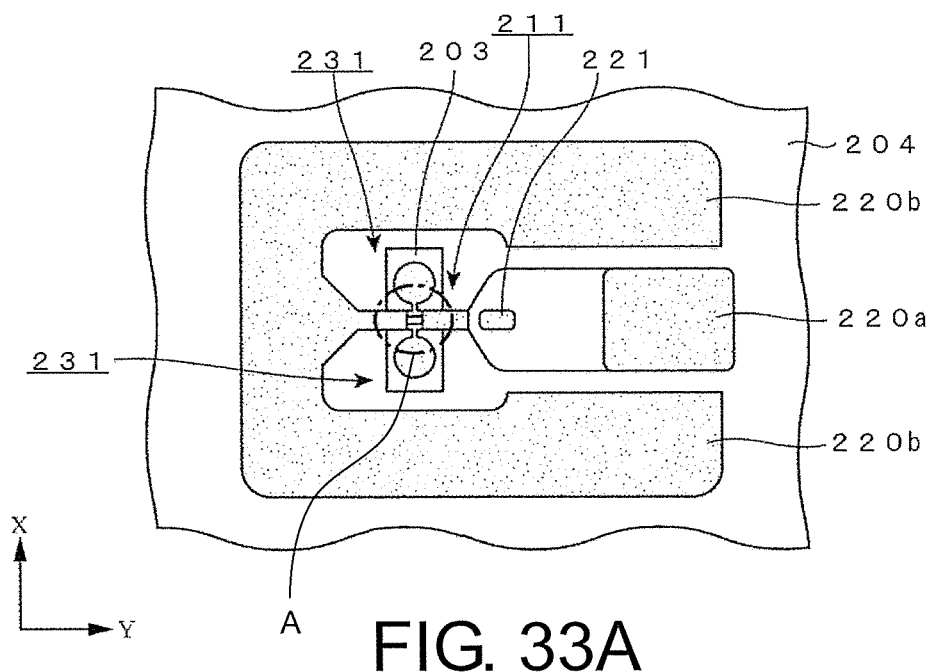
FIG. 33A is a top plan view illustrating the vibrator.
Figure 33B:
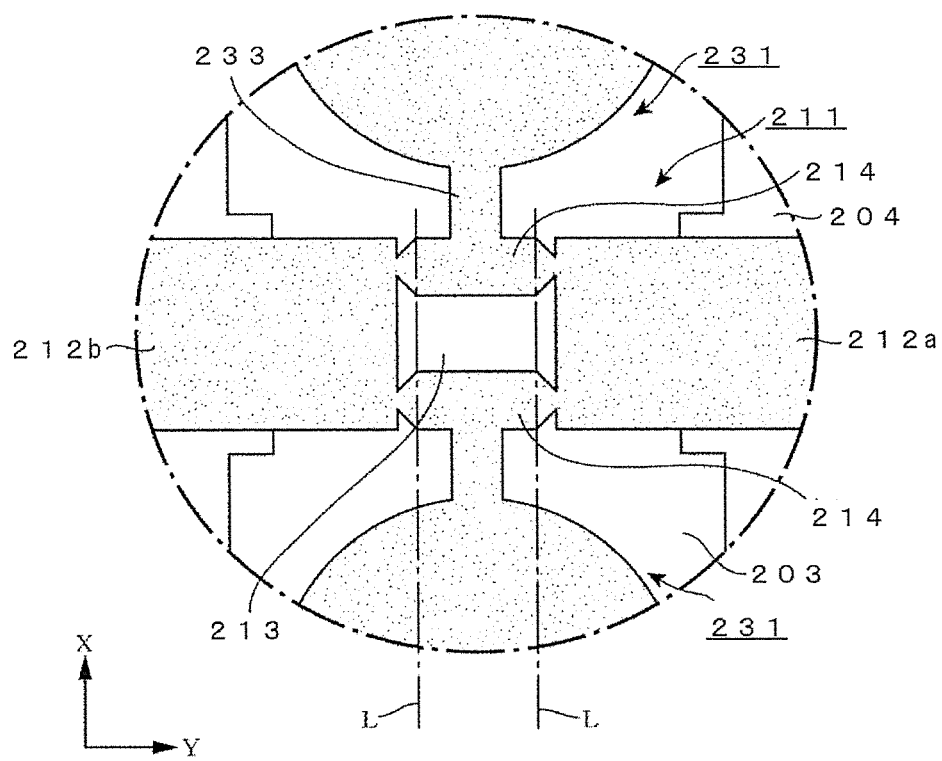
FIG. 33B shows an enlarged portion A of FIG. 33A.

The far-side base portion 212b of the two base portions 212 and 212 extends from the tuning fork type vibrating body 211 toward the far side while expanding its diameter to have an approximately trapezoidal shape, and also branches to split its distal end into right and left. Then, as illustrated in FIG. 33A and FIG. 33B, the respective distal ends branched into right and left flex toward the near side such that the respective distal ends extend along the lateral sides of the vibrating bodies 231 and 231, and also extend toward the lateral side of the aforementioned input/output port 220a. The base portion 212b and the vibrating bodies 211, 231, and 231 have surfaces with the metal films 216 that are integrally formed (by one film-forming process), and the metal films 216 and 216 on the two distal ends of the base portion 212b form the respective input/output ports 220b and 220b. The input/output port 220a at the center of the three input/output ports 220a, 220b, and 220b thus arranged in the horizontal direction are connected to the metal films 216 on the lower surfaces of the vibrating bodies 211, 231, and 231, and the input/output ports 220b and 220b at both lateral sides of the input/output port 220a are connected to the metal films 216 on the surfaces of the vibrating bodies 211, 231, and 231. Note that, in FIG. 33A and FIG. 33B, the area where the metal film 216 is formed in the tuning fork type vibrating body 211, and the vibrating bodies 231 and 231 are hatched.

In a portion, which is disposed at the tuning fork type vibrating body 211, held in a floating state over the nitride film 204 between the near-side and far-side base portions 212a and 212b, an opening 313 extending along the length of the tuning fork type vibrating body 211 is formed to vertically penetrate the tuning fork type vibrating body 211 in the center of the portion held in a floating state. Therefore, the areas extending in a forward-backward direction to connect the near-side and far-side base portions 212a and 212b in the left and right sides of the opening 213 constitute the vibration arm portions 214 and 214, respectively, in the tuning fork type vibrating body 211. These vibration arm portions 214 and 214 are made of a piezoelectric thin film such as aluminum nitride (AlN), and the vibration arm portions 214 and 214 are configured such that flexural vibration of is generated in the horizontal direction as a voltage is applied between the metal films 216 and 216 on both the upper and lower surfaces of the piezoelectric thin film as described below. The lengths and the widths of the respective vibration arm portion 214 and 214 are adjusted such that the resonance frequency f1 (for example, 30 to 200 MHz) in the flexural vibration is equal to the resonance frequency f2 of the vibrating bodies 231 and 231 in a reverse phase, specifically, 0.8×f2≤f1≤1.2×f2. The metal films 216 and 216 on both the upper and lower surfaces of the vibration arm portions 214 and 214 serve as excitation electrodes of the vibration arm portions 214 and 214, and also serve as extraction electrodes for inputting/outputting an electric signal to/from the vibrating bodies 231 and 231, as described below.

The respective vibration arm portions 214 and 214 have the centers in the longitudinal direction connected to one ends of the respective supports 233 and 233 that horizontally extend to the vibrating bodies 231 and 231. Additionally, as illustrated in an enlarged view, these vibration arm portions 214 and 214 in FIG. 33B on a top plan view are each configured such that both ends (portions in the near sides of the base portions 212a and 212b) in the longitudinal direction are narrower than portions connected to the supports 233 and 233. As shapes of the vibration arm portions 214 and 214, one vibration arm portion 214 in the right side when the vibration arm portions 214 and 214 are viewed from the near-side input/output ports 220a and 220b will be described with reference to FIG. 34.

The vibration arm portion 214 is formed in an approximately prismatic shape in an area around the connecting portion with the vibrating body 231, and the area has a width W1 that is 5 to 30% of the diameter in the vibrating body 231, which is 15 μm in this example. Additionally, the vibration arm portion 214 has an area at a distal end (an end at the far-side base portion 212b in FIG. 34) where the vibration arm portion 214 becomes smaller in diameter to have an approximately trapezoidal shape toward the distal end from a line L that is set in a near-side position distant from a connecting surface with the base portion 212b, for example, by 5 to 7 μm. That is, the vibration arm portion 214 has respective angles θ of 45° between both side surfaces of the vibration arm portion 214 and the line L at the distal end such that the connecting surface with the base portion 212b on a top plan view has a width W2 that is 3 to 15% of the diameter in the vibrating body 231. Therefore, the vibration arm portion 214 on a top plan view is horizontally symmetric with respect to a straight line passing through the center of the vibration arm portion 214 along the longitudinal direction of the vibration arm portion 214.

The vibration arm portion 214 also has a distal end at the near side (at the base portion 212a side) that is formed similarly to the aforementioned distal end at the base portion 212b side as illustrated in FIG. 33B, and thus the vibration arm portion 214 on a top plan view is symmetric in a forward-backward direction with respect to a straight line passing through the centers of the respective vibrating bodies 231 and 231. Additionally, another vibration arm portion 214 on the left side among a pair of vibration arm portions 214 and 214 is formed to have a similar shape to that of the vibration arm portion 214 on the right side. Accordingly, the pair of vibration arm portions 214 and 214 on a top plan view is symmetrical in intermediate positions of the vibration arm portions 214 and 214 with respect to a line extending along the longitudinal direction of the vibration arm portions 214 and 214.

Hereinafter, the reason that the shape of the vibration arm portion 214 is formed as described above will be described in detail. The vibration arm portion 214 has the same frequency as that of the contour vibration in the vibrating body 211, and also generates the flexural vibration in reverse phase. Then, the frequency of the flexural vibration in the vibration arm portion 214 is unambiguously determined by length, width W1 of the vibration arm portion 214. Therefore, generating vibration of the vibrator (the vibrating body 211) at a certain frequency forces the vibration arm portion 214 to have a shape (dimension) corresponding to this frequency. However, forming the vibration arm portion 214 with a uniform prismatic shape in the longitudinal direction causes deterioration of the characteristic since the energy propagates from the both ends of the vibration arm portion 214 to the base portions 212a and 212b.

Accordingly, with the uniform prismatic shape of the vibration arm portion 214 in the longitudinal direction, the both ends are fixed to the base portions 212a and 212b, thus suppressing vibration of the both ends. Therefore, in order to vibrate the vibration arm portion 214 with a frequency corresponding to the vibration frequency of the vibrator, there is a need for the vibration arm portion 214 with longer length as the both ends have difficulty in vibration. Accordingly, the vibrator becomes large in size. The metal film 216, which is used for inputting/outputting a signal to the vibrating bodies 211, 231, and 231, has larger electric resistance increased by the vibration arm portion 214 with longer length, thus causing deterioration of the characteristic. In order to improve, for example, strength of the vibration arm portion 214, thickening the widths W2 of the both ends in the vibration arm portion 214 more than the width W1 further suppresses the vibration of the both ends, thus causing deterioration of the characteristic more prominently.

Figure 34:
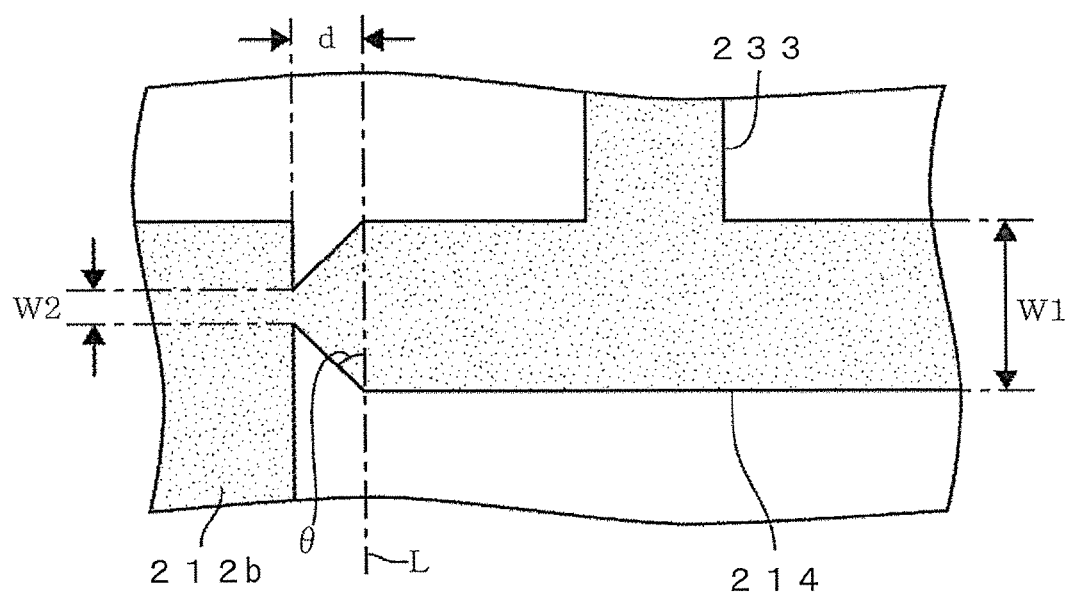
FIG. 34 is a partially enlarged top plan view illustrating the vibrator.

In contrast, if the vibration arm portion 214 in the longitudinal direction is set to, for example, the width W2 described in FIG. 34, that is, the vibration arm portion 214 is formed to have a thickness similar to those of the both ends in the longitudinal direction, the frequency of the flexural vibration in the vibration arm portion 214 becomes different from the frequency of the vibrator and strength for supporting the vibrating body 211 during the flexural vibration becomes insufficient.

In this disclose, the frequency of the flexural vibration in the vibration arm portion 214 is set to the value corresponding to the frequency of the vibrator while the both ends of the vibration arm portion 214 is formed to be narrower than the center. Therefore, difference in frequency of the vibration arm portion 214 is suppressed while leakage of vibration from the vibration arm portion 214 to the base portions 212a and 212b is suppressed. That is, a smaller contact area between the vibration arm portion 214 and the base portions 212a and 212b suppresses physical propagation of the vibration.

Narrowing the both ends of the vibration arm portion 214 ensures that the both ends are supported such that the both ends are able to vibrate, thus suppressing hindrance of vibration in the both ends. Accordingly, if the flexural vibration of the vibration arm portion 214 is generated with a certain frequency, the vibration arm portion 214 is finished to have a shorter length than that of the both ends with the same thickness of the center or that of both ends thicker than the center. Therefore, electric resistance in the metal film 216, which is used for inputting/outputting a signal to the vibrating bodies 211, 231, and 231, is suppressed and then deterioration of the characteristic is suppressed.

The supports 233 and 233 extending from the vibration arm portions 214 and 214 have distal ends that are connected to the disk-shaped outer circumferences of the respective vibrating bodies 231 and 231 with diameters of, for example, 50 μm. The vibrating bodies 231 and 231 are formed of the piezoelectric thin film (vibration plate) such as aluminum nitride and the like, and the vibrating bodies 231 and 231 includes the aforementioned metal films 216 and 216 on both the upper and lower surfaces as excitation electrodes. These vibrating bodies 231 and 231 are configured to generate the contour vibration in which the vibrating bodies 231 and 231 expands and contracts in a radial direction in a circumferential direction by using the center of the vibrating bodies 231 and 231 as a nodal point. In this case, dimensions such as diameters of the vibrating bodies 231 and 231 are aligned such that vibration is generated in phase. That is, when one vibrating body 231 expands, the other vibrating body 231 also expands. Similarly, when one vibrating body 231 contracts, the other vibrating body 231 also contracts.

Subsequently, a method of manufacturing the vibrator that includes the tuning fork type vibrating body 211 and the vibrating bodies 231 and 231 will be simply described using an example with a MEMS (Micro Electro Mechanical System) method. First, the oxide film 202 is formed on the base substrate 201, and the oxide film 202 is processed by patterning (etching) corresponding to the shape of the hollow portion 203. Next, the nitride film 204 is fowled led along an inner wall surface of the hollow portion 203 in the oxide film 202, and a sacrifice film (not illustrated) is stacked to be a thicker film than the depth of the hollow portion 203. Then, chemical mechanical polishing (CMP) is performed such that an internal area of the hollow portion 203 on the nitride film 204 is filled with the sacrifice film and the nitride film 204 in an external area of the hollow portion 203 is exposed. Subsequently, the metal film 216 made of, for example, molybdenum (Mo) and the like is formed on the base substrate 201 (the nitride film 204), and the metal film 216 is processed by patterning such that the shapes of the vibrating bodies 211, 231, and 231 and the base portions 212a and 212b are formed. Note that a sequence of the aforementioned process includes forming a photoresist film, pattern transfer to the photoresist film, and a dry etching process on the lower layer below the photoresist film in patterning of each film, which is simplified in the description.

Next, a piezoelectric thin film 241 made of aluminum nitride (AlN) and the like, which constitutes the vibrating bodies 211, 231, and 231 and the like, and the metal film 216 made of molybdenum and the like are stack over the metal film 216 from the bottom side in this order, so as to perform patterning on the metal film 216 such that the portion in FIG. 32 is left. Note that, in this patterning, in order to suppress pattern displacement between the piezoelectric thin film 241 and the metal film 216 on the top surface of the piezoelectric thin film 241 (referring to FIG. 37), an area corresponding to the opening 221 and its peripheral area may only be removed.

Additionally, the insulation film 242 made of silicon oxide film and the like and the photoresist mask 243 made of organic material and the like are stacked over the base substrate 201 from the bottom side in this order, and the photoresist mask 243 is processed by patterning such that an area other than the area corresponding to the vibrating bodies 211, 231, and 231, the base portions 212a and 212b, and the like opens.

Figure 37:
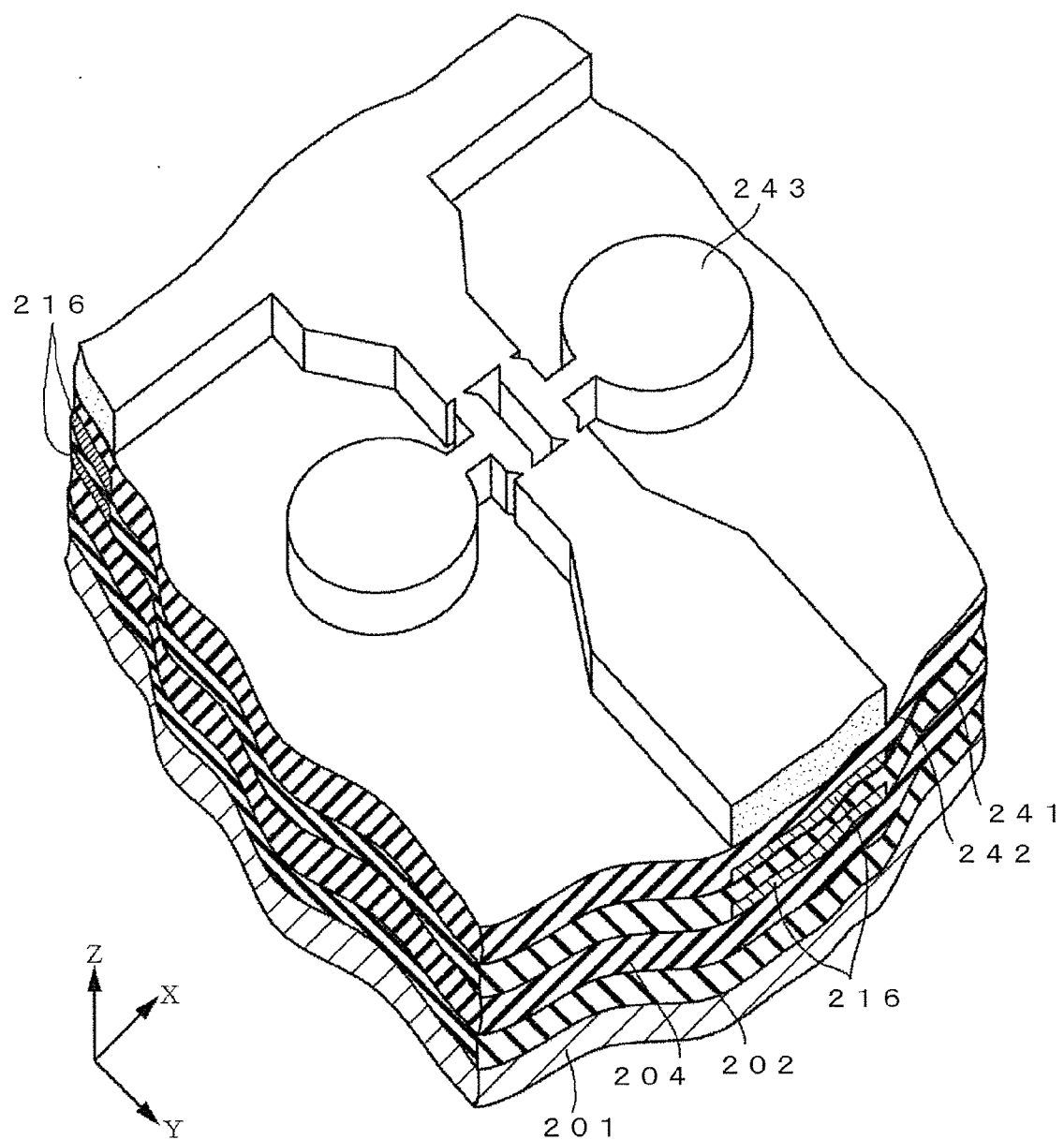
FIG. 37 is a perspective view illustrating a process in the middle of manufacturing the vibrator.

FIG. 37 illustrates the photoresist mask 243 after patterning, and the photoresist mask 243 on the upper surface side of the vibration arm portions 214 and 214 is formed corresponding to the shapes of the vibration a in portions 214 and 214 such that the both ends in the longitudinal direction are formed to have smaller width than those of an area in the centers of the both ends. Therefore, the insulation film 242 at the lower side is etched through the photoresist mask 243, the photoresist mask 243 then peels off, the piezoelectric thin film 241 is etched through the insulation film 242 as a mask, and then shapes of the vibrating bodies 211, 231, and 231 and the like are obtained corresponding to the area in FIG. 32.

Subsequently, in order to form the opening 221, the insulation film 242 is processed by patterning, another mask is then formed at the upper surface side of the insulation film 242, and the piezoelectric thin film 241 is etched so as to expose the metal film 216 at the lower side. After that, for example, a resist film (not illustrated) is formed such that the resist film is processed by patterning so as to expose a sacrifice film (not illustrated) filled in the hollow portion 203, and the silicon oxide film, which is exposed on the base substrate 201, is removed by wet etching using hydrofluoric acid-based etchant. Accordingly, the vibrator as illustrated in FIG. 32 is obtained after a cleaning process and the like. Then, for example, a large number of vibrators, which are formed on the base substrate 201 in the vertical and horizontal directions, are cut into individual pieces by dicing.

As an electric signal is externally input to the vibrator formed in the aforementioned process through the input/output ports 220a and 220b, the vibrating bodies 231 and 231 and the tuning fork type vibrating body 211 vibrate at respective resonance frequencies, and the electric signal based on the vibration is output through the input/output ports 220a and 220b. Specifically, for example, contour vibration caused by expansion and contraction in a radial direction is generated in the vibrating bodies 231 and 231 along the circumferential direction. In addition, flexural vibration is generated in the tuning fork type vibrating body 211 such that the vibration arm portions 214 and 214 approach or get apart from each other. Therefore, when the vibrating body 231 is seen on a top plan view, the contour vibration is symmetric with respect to the center of the vibrating body 231 in a left-right direction and a forward-backward direction.

Figure 38:
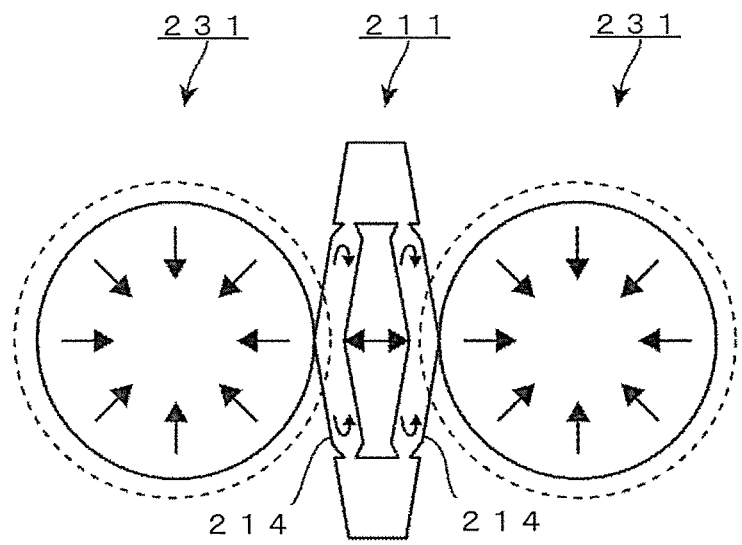
FIG. 38 is a schematic diagram illustrating a vibration state of the vibrator.
Figure 39:
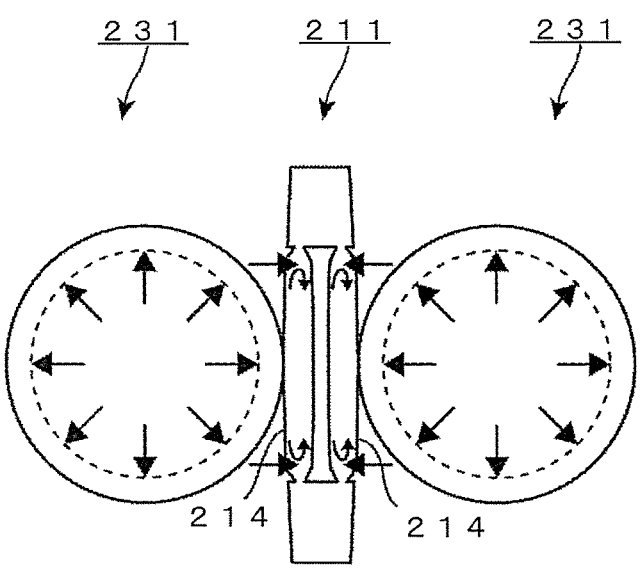
FIG. 39 is a schematic diagram illustrating a vibration state of the vibrator.

In this case, the contour vibration is generated from the vibrating bodies 231 and 231 in phase because the diameter and the like are mutually aligned. In addition, in the tuning fork type vibrating body 211, each dimension is adjusted to generate the flexural vibration at the same frequency as that of the vibrating bodies 231 and 231 in reverse phase. Therefore, the vibration arm portions 214 and 214 generate the flexural vibration to be separated from each other when the vibrating bodies 231 and 231 contract as illustrated in FIG. 38, whereas the vibration arm portions 214 and 214 generate the flexural vibration to approach each other when the vibrating bodies 231 and 231 expand as illustrated in FIG. 39. In this manner, the flexural vibration is generated in the tuning fork type vibrating body 211 such that vibration caused by the expansion and contraction of the vibrating bodies 231 and 231 is absorbed, that is, each of the center positions of the vibrating bodies 231 and 231 is not deviated by the contour vibration. Note that vibration generated in the tuning fork type vibrating body 211 and the vibrating bodies 231 and 231 is illustrated exaggeratively in FIG. 38 and FIG. 39.

In order to generate the flexural vibration, the vibration arm portion 214 has the both ends of the vibration arm portion 214 narrower than the center, thus suppressing leakage of the energy of the flexural vibration to the base portions 212a and 212b. That is, a connecting surface with a smaller area between the vibration arm portion 214 and the base portions 212a and 212b suppresses propagation of vibration in the vibration arm portion 214 to the base portions 212a and 212b. Accordingly, attenuation of vibration level is suppressed in the vibration arm portion 214.

Figure 40:
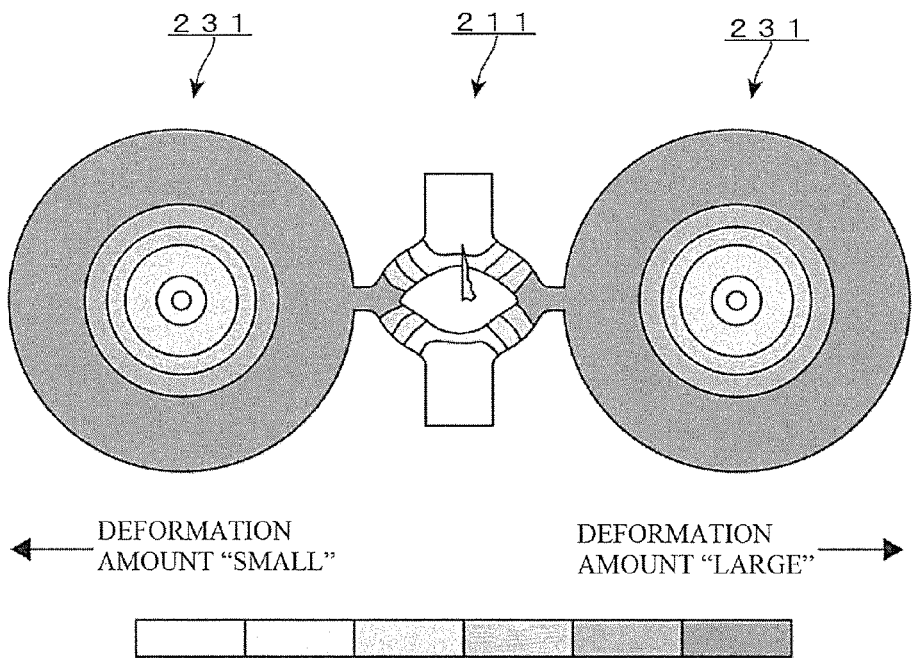
FIG. 40 is a characteristic diagram illustrating a simulation result obtained from the vibrator according to the second embodiment of this disclosure.

Here, a result of the simulation analysis performed for the vibration mode of the vibrator according to this disclosure is illustrated in FIG. 40. Since the tuning fork type vibrating body 211 is vibrated (deformed) in addition to the vibrating bodies 231 and 231, a nodal point (area having a small deformation amount) is formed in the center of each of the vibrating bodies 231 and 231, and the deformation amount increases as close to the outer circumference, so that an ideal vibration mode in which a uniform deformation amount is obtained along the circumferential direction is implemented in each of the vibrating bodies 231 and 231. Note that, in this simulation, the vibration arm portions 214 and 214 are each formed to have a prismatic shape (where the both ends are not narrowed).

Figure 41:
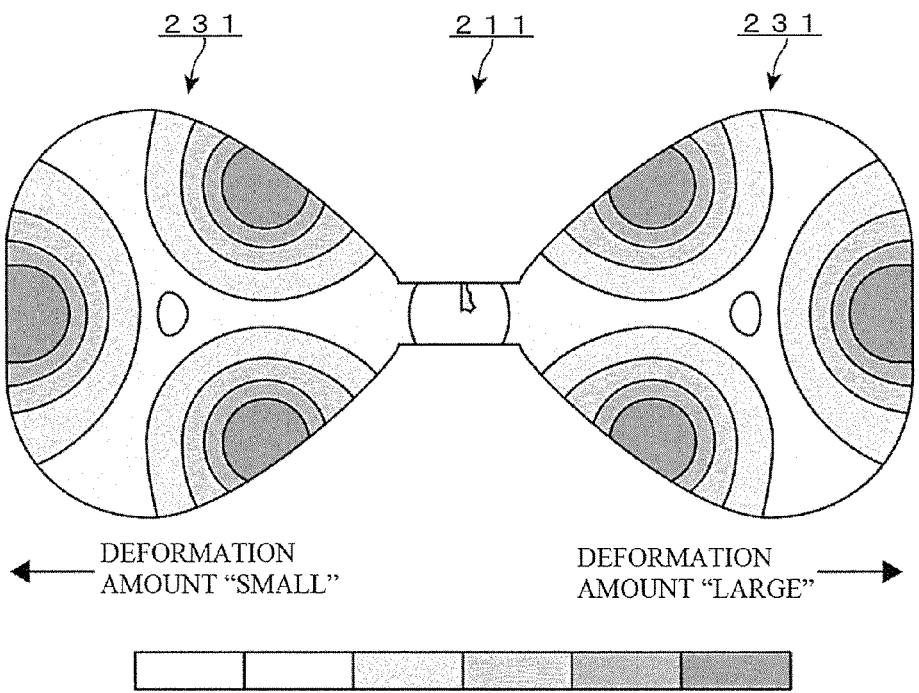
FIG. 41 is a characteristic diagram illustrating a simulation result obtained from a conventional vibrator.
Figure 42:
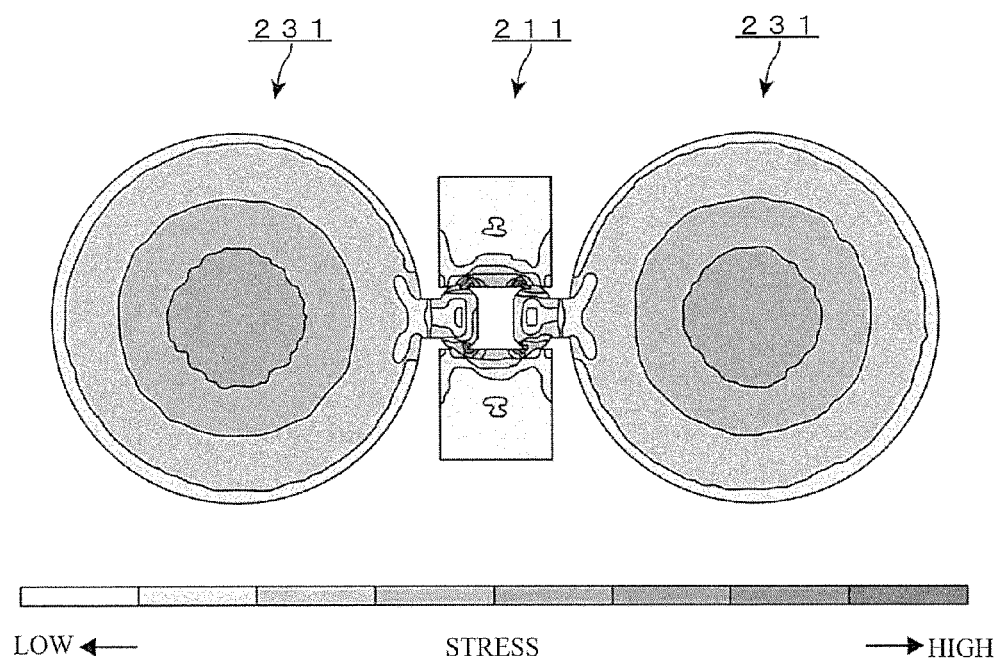
FIG. 42 is a characteristic diagram illustrating a simulation result obtained from the vibrator according to the second embodiment of this disclosure.
Figure 43:
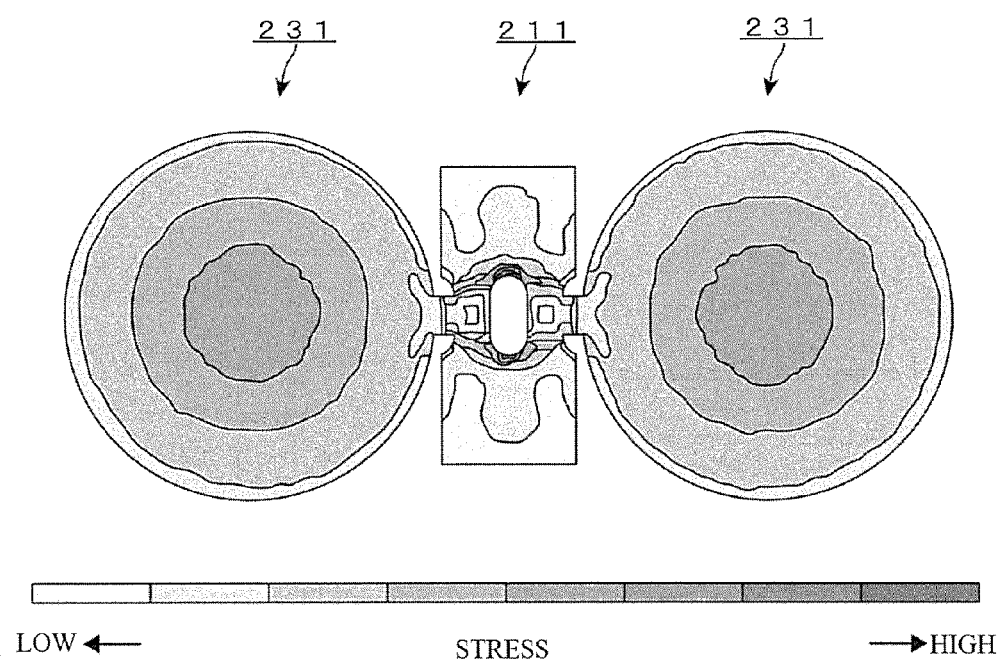
FIG. 43 is a characteristic diagram illustrating a simulation result for comparison with the vibrator according to the second embodiment of this disclosure.

Meanwhile, for example, when a rectangular connecting portion is provided between the vibrating bodies 231 and 231 instead of the tuning fork type vibrating body 211, the nodal point is formed in an approximate center of the vibrating bodies 231 and 231 as illustrated in FIG. 41. However, the deformation amount is not uniform along the radial direction and the circumferential direction. Therefore, in FIG. 41, it is recognized that the Q-value is deteriorated compared to the case of FIG. 40. FIG. 42 illustrates a result of stress analysis when resonance is generated in the case where the both ends of the vibration arm portions 214 and 214 are narrower than the center. It is recognized that stress is generated in the base portions 212a and 212b while the stress is suppressed to be extremely low. In contrast, in the case where the both ends of the vibration arm portion 214 are not narrowed and made thicker than the center, stress is generated over a wide range of the base portions 212a and 212b as illustrated in FIG. 43, thus allowing vibration of the vibration arm portion 214 to widely propagate to the base portions 212a and 212b.

According to the embodiment described above, the tuning fork type vibrating body 211 is interposed between the two vibrating bodies 231 and 231 by narrowing the both ends of the vibration arm portion 214 more than the center, thus suppressing leakage of the energy from the vibration arm portion 214 to the base portions 212a and 212b and then suppressing deterioration of the characteristic. Narrowing the both ends of the vibration arm portion 214 more than the center suppresses the length of the vibration arm portion 214 as described above, thus suppressing electric resistance of the vibrator and obtaining the downsized vibrator with satisfactory characteristics. While in the aforementioned vibrator of FIG. 42, a resistance value was calculated and the calculated value was 20Ω, a resistance value in the vibrator of FIG. 43 was 30Ω, thus being significantly improved by 30% That is, in order to vibrate the tuning fork type vibrating body 211 with a certain frequency, there is a need for the vibration arm portion 214 with longer length in FIG. 43 due to hindrance of vibration in the both ends of the vibration arm portion 214, thus increasing electric resistance compared with that of the vibrator in FIG. 42.

In order to narrow the both ends of the vibration arm portion 214 more than the center, the process for etching the piezoelectric thin film 241 is employed so as to form outline of the vibration arm portion 214, thus suppressing reduction of throughput compared with, for example, a case where an extra process is provided in addition to the sequence of the processes for manufacturing the vibrator. Accordingly, in order to suppress leakage of the energy from the vibration arm portion 214, the method according to this disclose ensures higher productivity than, for example, a case where the base portions 212a and 212b have constricted portions on their side surfaces.

The tuning fork type vibrating body 211 is interposed between the vibrating bodies 231 and 231 which generate contour vibration in phase, and the tuning fork type vibrating body 211 vibrates in reverse phase with respect to the vibrating bodies 231 and 231 so as to absorb expansion and contraction of the vibrating bodies 231 and 231. Accordingly, this suppresses hindrance of vibration in each of the vibrating bodies 231 and 231, thus suppressing deterioration of the electric characteristic. Additionally, not the center of the vibrating body 231 but the outer circumference of the vibrating body 231 is supported on a top plan view, and this forms the aforementioned contour vibration while suppressing hindrance of the vibration. Therefore, if a large number of vibrators are industrially manufactured, variation in characteristics of the vibrators is suppressed.

In this manner, according to this disclosure, the connecting portion used to connect a pair of vibrating bodies 231 and 231 and supported by the base substrate 201 also serves as a vibrating body which vibrates in reverse phase to vibration of the vibrating bodies 231 and 231. Meanwhile, in the related art, since no attention has been given to a function of the connecting portion as a vibrating body, there has been no study for the shape, the dimension, and the like of the connecting portion. That is, since the connecting portion has a dimension significantly smaller than that of the vibration plate in the configuration disclosed in Japanese Patent Application No. 2008-124747 described in the paragraphs of Background, the connecting portion generates a frequency significantly higher than the resonance frequency of the vibration plate even when the connecting portion vibrates. For this reason, vibration of the connecting portion is negligible compared to vibration of the vibration plate.

In contrast, according to this disclosure, the connecting portion between the vibrating bodies 231 and 231 is configured using the tuning fork type vibrating body 211 to vibrate in reverse phase to vibration of the vibrating bodies 231 and 231 as described above. In this case, flexural vibration has a resonance frequency lower than that of the aforementioned contour vibration even when the vibration body (tuning fork type vibrating body 211 or vibrating body 231) has the same dimension. In other words, when the tuning fork type vibrating body 211 is vibrated at the same frequency as that of the vibrating body 231, the tuning fork type vibrating body 211 has a dimension smaller than that of the vibrating body 231. For this reason, when the tuning fork type vibrating body 211 is vibrated at the same frequency as that of the vibrating bodies 231 and 231 in reverse phase, it is not necessary to increase a dimension of the tuning fork type vibrating body 211 to be substantially equal to that of the vibrating body 231. Therefore, it is possible to suppress a dimension of the vibrator from increasing and suppress deterioration of the electric characteristic. Moreover, since the base portions 212 and 212 are provided in both sides of the vibration arm portions 214 and 214, it is possible to robustly hold the vibration arm portions 214 and 214 against the base substrate 201 when the vibration arm portions 214 and 214 vibrate.

Figure 44:
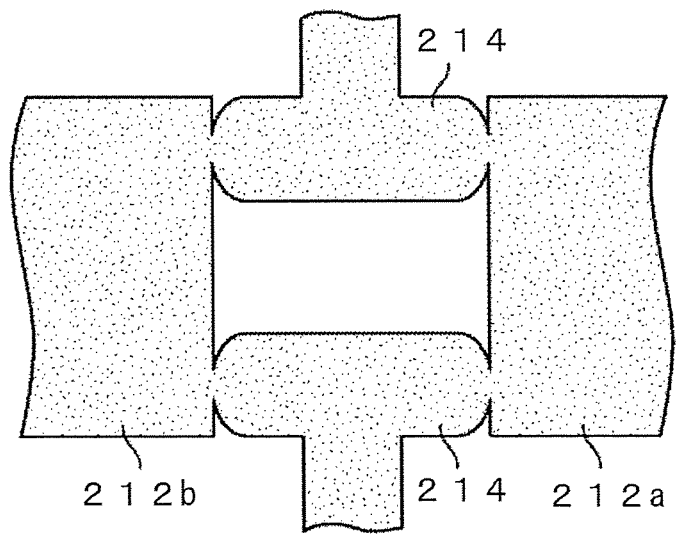
FIG. 44 is a partially enlarged top plan view illustrating another example of the vibrator.
Figure 45:
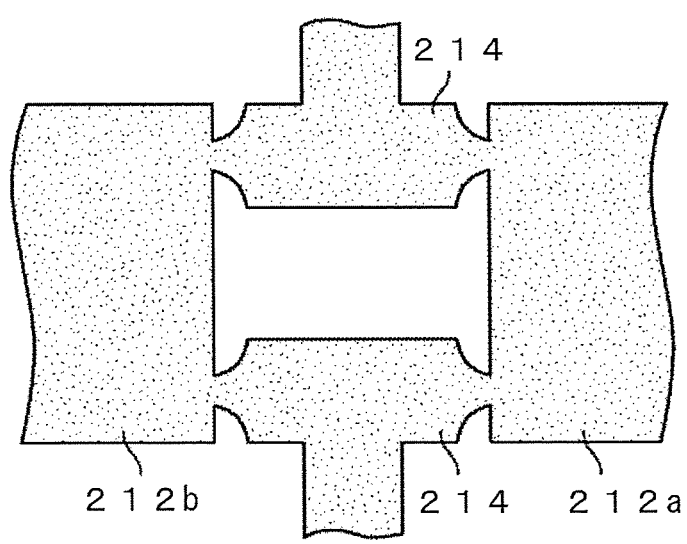
FIG. 45 is a partially enlarged top plan view illustrating another example of the vibrator.

Other examples of the aforementioned vibrator will be described below. FIG. 44 and FIG. 45 illustrate examples where the both ends of the vibration arm portion 214 have a width W1 that becomes smaller along curving lines from the center to the end instead of having a width W1 that becomes smaller along a straight line. The both ends of the vibration arm portion 214 are formed to be arc-shaped such that the outer circumference expands outward in FIG. 44 while the both ends are formed to be arc-shaped such that the outer circumference narrows inward in FIG. 45.

Figure 46:
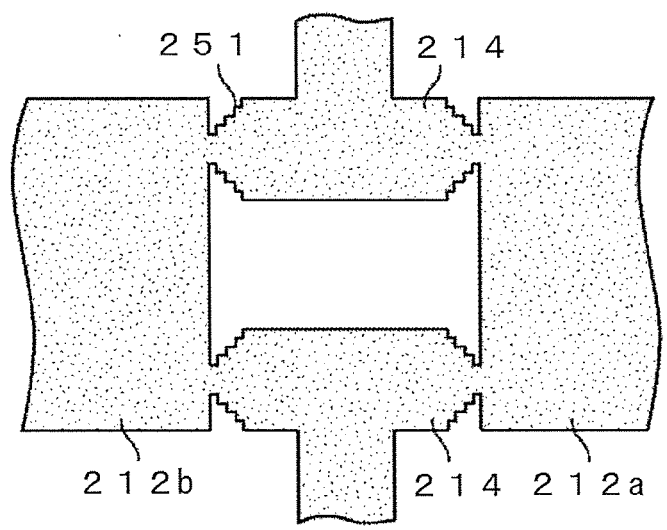
FIG. 46 is a partially enlarged top plan view illustrating another additional example of the vibrator.
Figure 47:
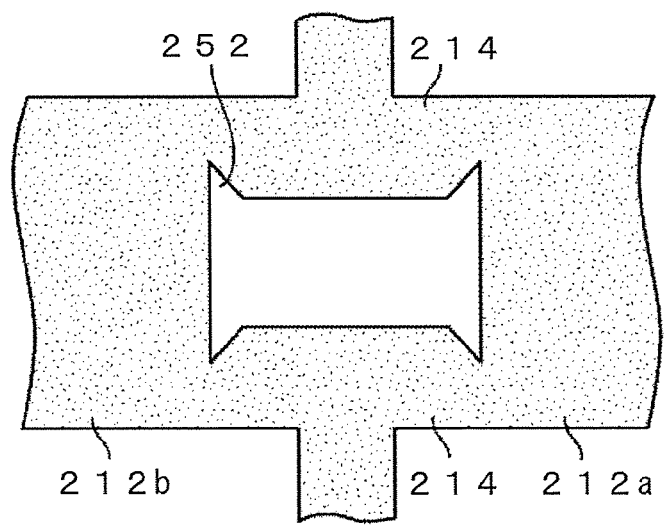
FIG. 47 is a partially enlarged top plan view illustrating another additional example of the vibrator.

FIG. 46 illustrates an example where a plurality of stepped portions 251 are disposed in the both ends of the vibration arm portion 214 such that a width W1 of the vibration arm portion 214 is formed to become smaller in a staircase pattern. FIG. 47 illustrates an example where one vibration arm portion 214 among a pair of vibration arm portions 214 has a side surface where, for example, approximately triangular notched portions 252 are formed on respective side surfaces of the both ends at the other vibration arm portion 214 (inside surface) side on a top plan view while side surfaces of the both ends at the vibrating body 211 (outside surface) side are linearly formed from the center toward the base portions 212a and 212b. Therefore, the one vibration arm portion 214 is not symmetric with respect to a straight line passing through the center of the vibration arm portion 214 in the longitudinal direction on a top plan view of the vibration arm portion 214. Further, the other vibration arm portion 214 is formed to be symmetrical to the one vibration arm portion 214 with respect to the straight line passing through an intermediate position between these vibration arm portions 214 and 214 in the longitudinal direction of the vibration arm portion 214.

Figure 48:
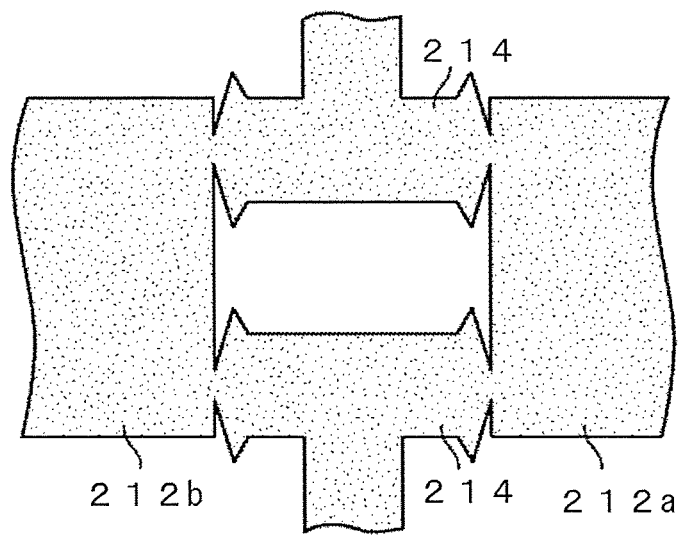
FIG. 48 is a partially enlarged top plan view illustrating another example of the vibrator.
Figure 49:
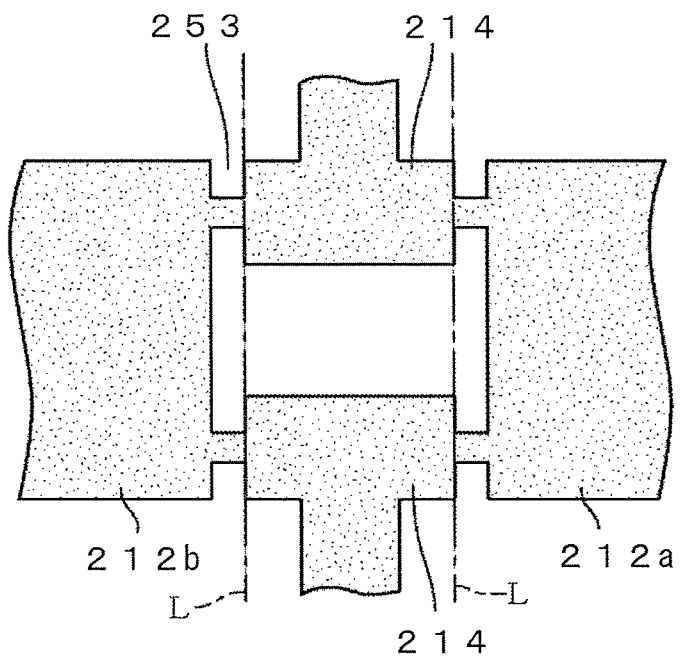
FIG. 49 is a partially enlarged top plan view illustrating another example of the vibrator.

Additionally, FIG. 48 illustrates an example where the vibration arm portion 214 expands outward from the center toward the end, and then contracts its diameter so as to obtain the aforementioned width W2. FIG. 49 illustrates an example where a columnar portion 253 that is narrower (in width W2) than the vibration arm portion 214 is disposed at the base portions 212a and 212b side with respect to the aforementioned line L instead of contracting the diameters of the both ends in the vibration arm portion 214 along a straight line or a curved line.

Figure 50:
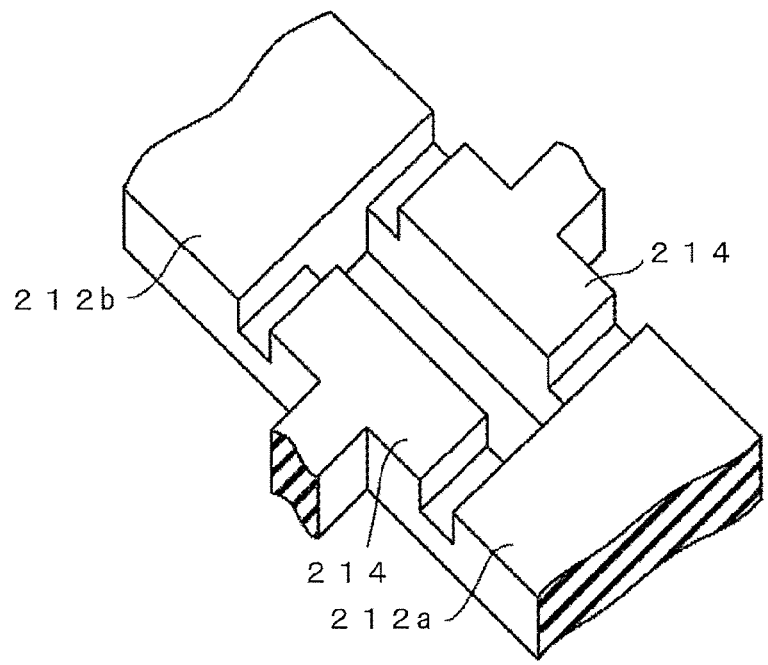
FIG. 50 is a partially enlarged perspective view illustrating another example of the vibrator.

Additionally, FIG. 50 illustrates an example where the both ends is narrowed instead of narrowing the both ends of the vibration arm portion 214 compared with the center. In this case, the both ends is etched through a resist film (not shown), thus forming the metal film 216 after forming the piezoelectric thin film 241 on the base substrate 201 and before forming the metal film 216 at the upper layer side. Additionally, the both ends may be narrowed as described above at the same time the both ends are thus formed to be narrow.

In conclusion, the vibration arm portion 214 in this disclosure is formed such that the dimension of the connecting portion with the base portions 212a and 212b is smaller in at least one of width (diameter) and thickness than the dimension of the connecting portion with the vibrating body 211. In FIG. 50, the metal film 216 is not illustrated and the base portions 212a and 212b are partially cut away.

Figure 51:
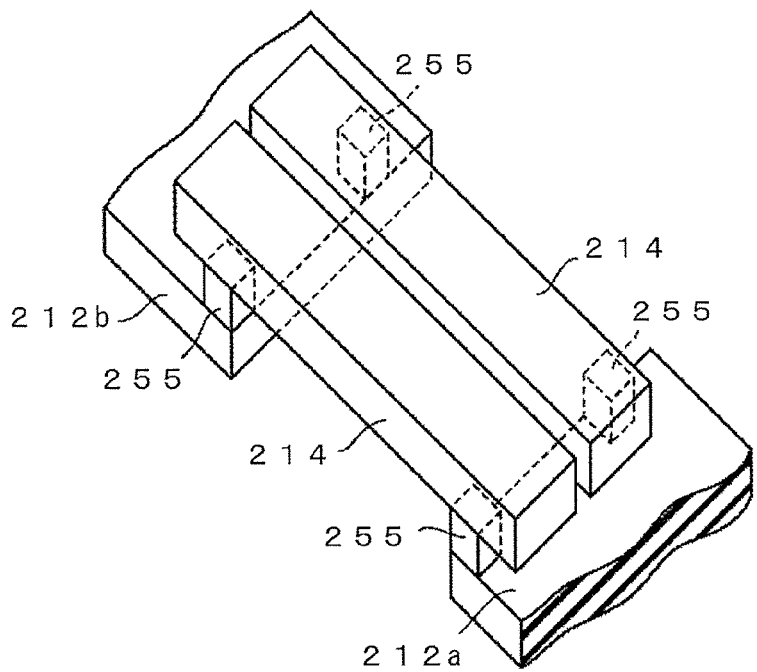
FIG. 51 is a partially enlarged perspective view illustrating another example of the vibrator.

FIG. 51 illustrates an example where an approximately columnar support 255 is disposed in two positions on the respective upper surfaces of the base portions 212a and 212b in the horizontal direction, and these supports 255 is constituted to support the vibration arm portion 214 from the bottom side. The vibration arm portion 214 is formed to be a prismatic shape such that a width W1 is constant in the longitudinal direction. The support 255 on a top plan view has a surface area that is formed to be smaller than a cross-sectional area that is perpendicular to a planar surface in the longitudinal direction of the vibration arm portion 214. This support 255 is a member to support the vibration arm portion 214, in other words, the support 255 forms a part of the base portions 212a and 212b or the support 255 forms a part of the vibration arm portion 214 since the support 255 vibrates together with the vibration arm portion 214. Therefore, in this disclosure, the vibration arm portion 214 has a portion of at the base substrate 201 side with a smaller thickness or width than the connecting portion that is connected to the vibrating body 211.

A brief description will be given of a process for forming the vibration arm portion 214 as illustrated in FIG. 51 where the insulation film 242 and the photoresist mask 243 for etching the piezoelectric thin film 241 is formed by patterning such that the outline of the vibration arm portion 214 is not formed, that is, an area between the two base portions 212a and 212b is exposed. Subsequently, the base portions 212a and 212b and the vibrating body 211 are formed and the piezoelectric thin film is formed and etched again so as to form the support 255. Subsequently, the piezoelectric thin film is similarly formed and etched so as to form the vibration arm portion 214 on the upper side surface of the support 255. Over the structure thus formed, masking agent that is formed by patterning is applied such that a portion including the metal film 216 at the upper layer side is exposed, and electroless plating is also performed so as to form the metal film 216.

Figure 52:
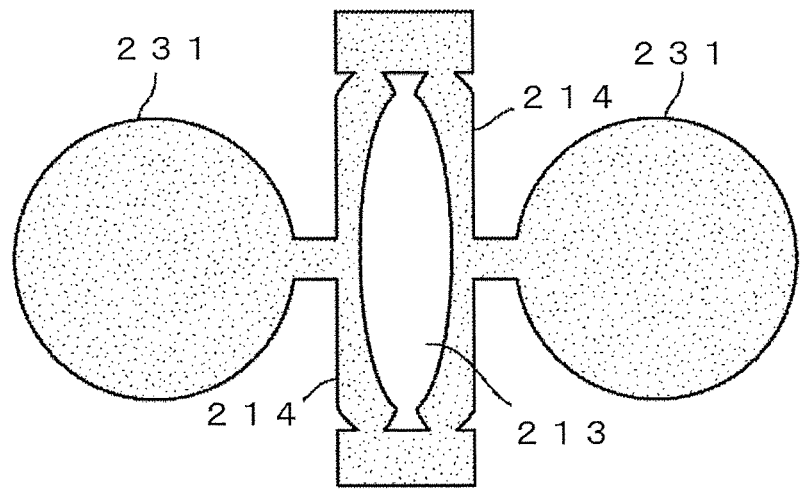
FIG. 52 is a partially enlarged top plan view illustrating another example of the vibrator.
Figure 53:
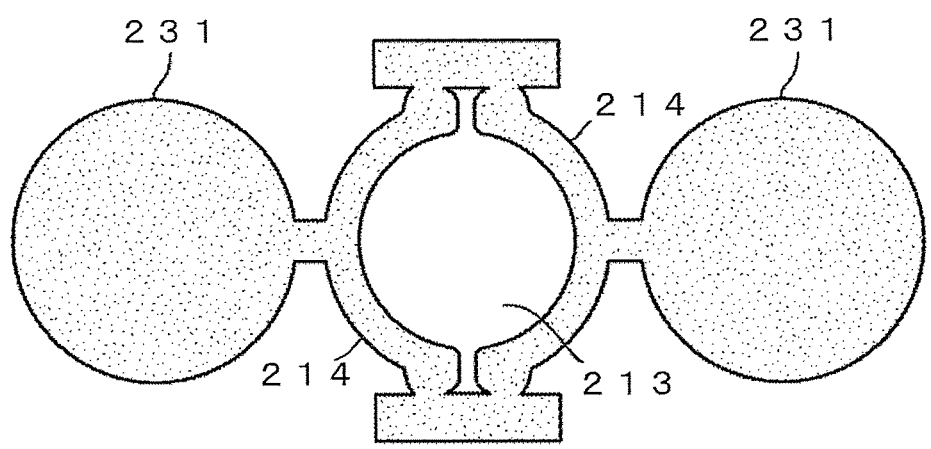
FIG. 53 is a partially enlarged top plan view illustrating another example of the vibrator.
Figure 54:
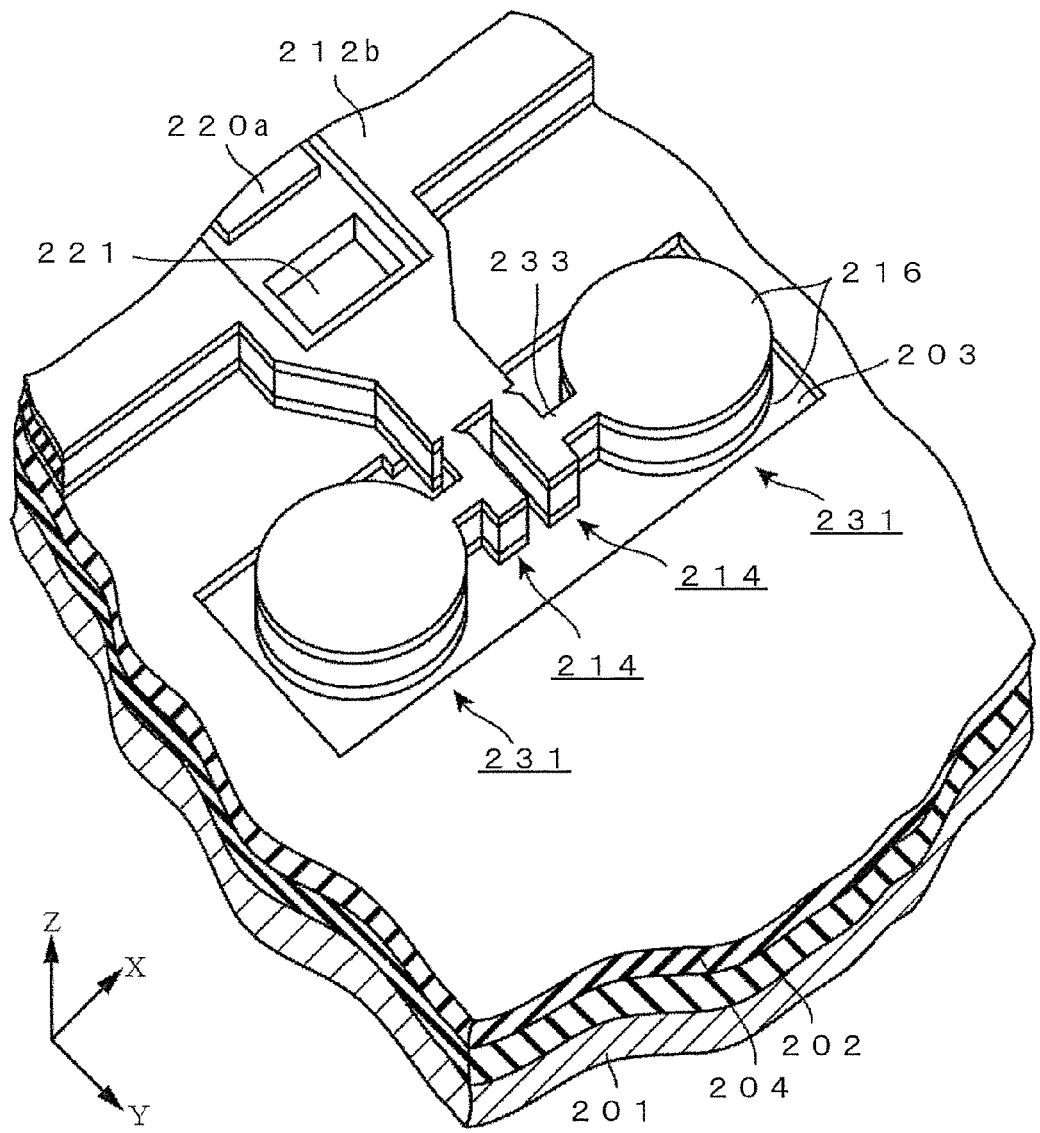
FIG. 54 is a partially enlarged perspective view illustrating another example of the vibrator.

In addition, any configuration of the tuning fork type vibrating body 211 may be employed if it can generate vibration in reverse phase to vibration of the vibrating bodies 231 and 231. For example, the opening 213 may be formed in an approximately elliptical shape as illustrated in FIG. 52. In addition, as illustrated in FIG. 53, the opening 213 may be formed in an approximately circular shape, and the vibration arm portions 214 and 214 may be formed in an approximately arc shape along the circumference of the opening 213. Furthermore, as illustrated in FIG. 54, for example, each of the vibration arm portions 214 and 214 may be supported by the far-side base portion 212b using a so-called cantilevered structure without providing the near-side base portion 212a. In FIG. 54, the respective input/output port 220a and opening 221 are formed at the base portion 212b side.

Figure 55:
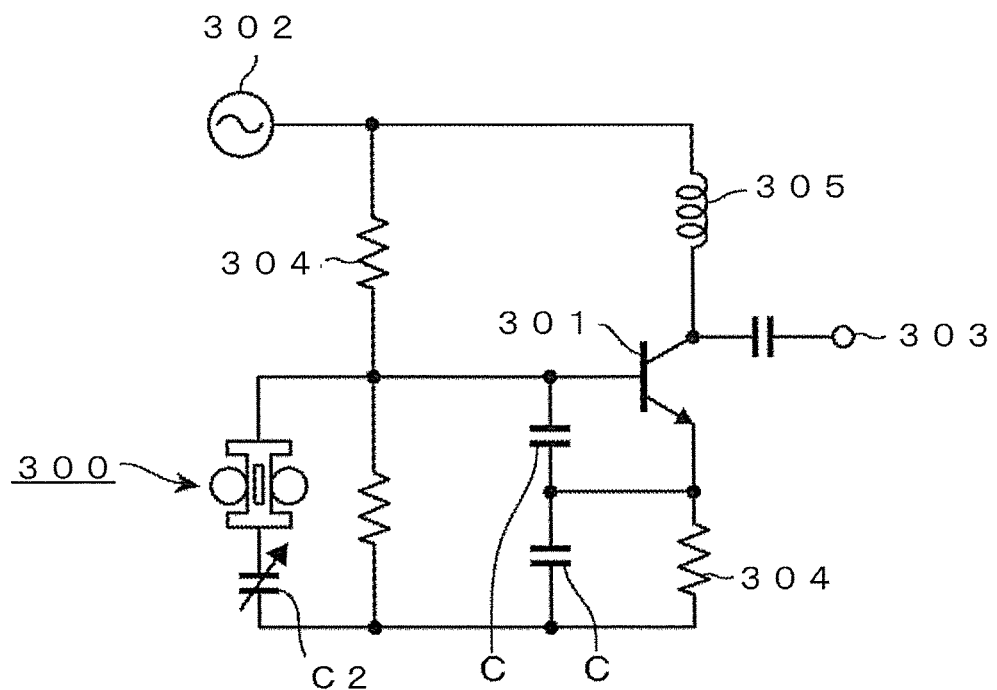
FIG. 55 is a schematic diagram illustrating an electric circuit in which the vibrator is employed.

Description will be made in brief with reference to FIG. 55 for an example of an electric circuit of an electric component (oscillator) obtained by assembling the vibrator according to this disclosure described above with an oscillation circuit. FIG. 55 illustrates an example of a Colpitts circuit including a transistor 301 and a pair of capacitors C and C connected in series. A series circuit including the vibrator 300 disclosed herein and a variable capacitor C2 is connected to a base terminal of the transistor 301. A power supply 302 is connected to a node between the base terminal and the vibrator 300, and an output port 303 for outputting the electric signal is connected to a collector terminal of the transistor 301. In FIG. 55, the reference numeral 304 denotes resistance, and the reference numeral 305 denotes an inductance.

In the case where the width W2 of the connecting portion between the vibration arm portion 214 and the base portions 212a and 212b is too large (too close to the width W1 at the center of the vibration arm portion 214), a function that suppresses leakage of the vibration from the vibration arm portion 214 is deteriorated while in the case where the width W2 is too small, it is difficult to physically support the vibration arm portion 214 and the vibrating body 211, and thus it is preferred that the width W2 be in the aforementioned range. A smaller diameter of the vibrating body 211 (a higher vibration frequency of the vibrating body 211) results in a narrower width W1 of the vibration arm portion 214 (alternatively, a thinner thickness) corresponding to a vibration frequency of the vibrating body 211, thus having difficulty in obtaining difference between the widths W1 and W2. In contrast, a larger diameter of the vibrating body 211 results in a longer etching time when the aforementioned MEMS method is performed or a reduced number of vibrators formed on the base substrate 201. That is, the diameter of the vibrating body 211 is preferred to be, for example, 60 to 390 μm that is 100 to 14 MHz in frequency of the vibrator.

Additionally, in the case where a length d (a dimension between the line L and the base portion 212b in FIG. 34) in an area where the width or the thickness is reduced compared with the center of the vibration arm portion 214 in the longitudinal direction is too small, patterning is difficult while in the case where the length d is too large, electric loss increases and this leads to increase in electric resistance, and thus the length d is appropriately set considering characteristics needed for the vibrator. While the pair of vibration arm portions 214 and 214 are formed to be symmetrical to each other, these vibration arm portions 214 and 214 may be formed not to be symmetrical to each other, and the thickness and width may be adjusted such that the vibration arm portions 214 and 214 generates the flexural vibration in phase at the same frequency. The aforementioned vibrating bodies 231 and 231 may have an elliptical shape, a triangular shape, a rectangular shape, or the like instead of a circular shape.

In the tuning fork type vibrating body 211, the metal film 216 is shared by the excitation electrode for vibrating the tuning fork type vibrating body 211 and the extraction electrode which connects the excitation electrode of the vibrating bodies 231 and 231 and the input/output ports 220a and 220b. However, the excitation electrode and the extraction electrode may be separately arranged.

Although the vibrator disclosed herein is integrated with the oscillation circuit in the example described above, the vibrator may be used as a filter (electronic component). In this case, the electric signal input to the input/output port 220a (220b) is output from the input/output port 220b (220a) after electric signals unnecessary in the vibrator are removed.

The aforementioned vibrator may be configured as follows. In the vibrator described above, electrode patterns for adjusting resonance frequencies of the first and second vibrating bodies may be formed in one of the vibration arm portions and the other vibration arm portion, respectively. In addition, each of the electrode patterns may be obtained by forming a plurality of electrode films by interposing a gap area therebetween. Furthermore, the electrode pattern of one of the vibration arm portions and the electrode pattern of the other vibration arm portion may be formed symmetrically to each other by interposing a line between one of the vibration arm portions and the other vibration arm portion.

In the vibrator described above, the excitation electrode of one of the vibration arm portions and the excitation electrode of the other vibration arm portion may also serve as the first and second extraction electrodes, respectively. In addition, the base portion may be formed in each of one of the vibration arm portions and the other vibration arm portion and is supported by the base substrate, and the input/output port may be formed in each of the base portion. The electronic component according to this disclosure includes the aforementioned vibrator.

According to an aspect of the disclosure, there is provided a method of manufacturing the vibrator including: forming a tuning fork type vibrating body over a base substrate, the tuning fork type vibrating body having a base portion supported by the base substrate, a pair of vibration arm portions extending from the base portion separately from each other, each of which includes a piezoelectric body, and a pair of excitation electrodes formed to interpose each of the vibration arm portions; forming a first vibrating body having a piezoelectric thin film of which an outer circumference is connected to one of the vibration arm portions and a pair of excitation electrodes formed to interpose the piezoelectric thin film in a thickness direction, the first vibrating body being configured to generate contour vibration by expansion and contraction between a center of the piezoelectric thin film and the outer circumference; forming a second vibrating body having a piezoelectric thin film of which an outer circumference is connected to the other vibration arm portion and a pair of excitation electrodes formed to interpose the piezoelectric thin film in a thickness direction, the second vibrating body being configured to generate contour vibration in phase with the first vibrating body; forming a first extraction electrode connected to the excitation electrode of the first vibrating body in one of the vibration arm portions; forming a second extraction electrode connected to the excitation electrode of the second vibrating body in the other vibration arm portion; forming an input/output port in the base portion to input/output an electric signal to/from each of the first extraction electrode, the second extraction electrode, and the excitation electrode of the vibration arm portion, and forming electrode patterns for adjusting resonance frequencies of the first and second vibrating bodies in one of the vibration arm portions and the other vibration arm portion, respectively, wherein the tuning fork type vibrating body is configured to absorb contour vibration of the first and second vibrating bodies and generate flexural vibration in reverse phase to vibration of the first and second vibrating bodies.

The method described above may further include adjusting each of resonance frequencies of the first and second vibrating bodies while aligning the resonance frequencies by removing the electrode pattern after forming the electrode pattern, such that the electrode pattern of one of the vibration arm portions and the electrode pattern of the other vibration arm portion are formed symmetrically to each other by interposing a line between one of the vibration arm portions and the other vibration arm portion.

In the vibrator described above, between a pair of vibrating bodies configured such that contour vibration caused by expansion and contraction between a center of the piezoelectric thin film and an outer circumference is generated in phase, the base portion is supported by the base substrate, the tuning fork type vibrating body having a pair of vibration arm portions is interposed as the connecting portion, and one of the vibration arm portion and the other vibration arm portion are connected to the outer circumference of the piezoelectric thin film in each of the vibrating bodies. In addition, the tuning fork type vibrating body is configured to generate flexural vibration in reverse phase to vibration of the first and second vibrating bodies in order to absorb contour vibration of the vibrating bodies. For this reason, it is possible to suppress hindrance of vibration in each of the vibrating bodies and suppress deterioration of the electric characteristic. Furthermore, since the electrode pattern for adjusting the resonance frequencies of the vibrating bodies is formed in each of the vibration arm portions, it is possible to adjust each resonance frequency while vibration balance between vibrating bodies is kept.

According to an aspect of the disclosure, there is provided a vibrator including: a base substrate; a tuning fork type vibrating body having a base portion on the base substrate, a pair of vibration arm portions extending from the base portion separately from each other, and excitation electrodes being configured to vibrate each of the vibration arm portions; first and second vibrating bodies each having a vibration plate of which an outer circumference is supported by one of the vibration arm portions and the other of the vibration arm portions, the vibration plate having the respective excitation electrodes, the first and second vibrating bodies being configured to generate the contour vibration in mutually reverse phase; and an input/output port foamed in the base portion to input/output an electric signal to/from each of the pair of the vibration arm portions, the first extraction electrode, and the second extraction electrode, wherein the tuning fork type vibrating body is configured to absorb contour vibration of the first and second vibrating bodies and generate flexural vibration in reverse phase to vibration of the first and second vibrating bodies, and one vibration arm portion and the other vibration an portion are each formed to have at least one dimension of broadness and thickness, the dimension being formed such that a dimension in a connecting portion with the base portion is smaller than a dimension in a connecting portion with the vibration plate.

One vibration arm portion and the other vibration arm portion may be formed to be symmetrical to each other in an intermediate position of the vibration arm portion with respect to a line on a top plan view, and the line extends in a longitudinal direction of the vibration arm portion. The vibration arm portion, the vibration plate in the first vibrating body, and the vibration plate in the second vibrating body may be formed at the same time by dry etching process using a photoresist mask. In addition, the pair of vibration arm portions may be formed such that a dimension in the connecting portion with the base portion is smaller than a dimension in the connecting portion with the vibration plate. The respective vibration arm portions may be formed to gradually decrease in width from the connecting portion with the vibration plate toward the connecting portion with the base portion. The base portion may be formed on each of one end and the other end in a longitudinal direction of the pair of vibration arm portions. According to an aspect of the disclosure, there is provided an electronic component including one of the aforementioned vibrators.

In this disclose, the tuning fork type vibrating body interposes between two vibrating bodies that generates contour vibration in phase. The tuning fork type vibrating body includes the base portion supported by the base substrate, and also includes the pair of vibration arm portions. Each of the vibration arm portions is configured to generate the flexural vibration in reverse phase to vibration of the vibrating bodies so as to absorb contour vibration of the vibrating bodies. Additionally, each of the vibration arm portion is formed to have at least one dimension of broadness and thickness that is formed such that a dimension in a connecting portion with the base portion is smaller than a dimension in a connecting portion with the vibrating body. Accordingly, this suppresses hindrance of vibration in the vibrating body and also suppresses leakage of vibration from the vibration arm portion to the base portion. Additionally, the base substrate supports not the center of the vibrating body but the outer circumference in order to support the vibrating body with the base substrate. This suppresses deterioration of the electric characteristic while suppressing variation in characteristics of the vibrating body.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A vibrator comprising:
   a base substrate;
   a tuning fork type vibrating body including a base portion, a pair of vibration arm portions having a pair of first excitation electrodes, the base portion being supported by the base substrate, the pair of vibration arm portions extending from the base portion away from each other, each of the pair of vibration arm portions including a piezoelectric body, the pair of first excitation electrodes sandwiching each of the vibration arm portions;
   a first vibrating body including a vibration plate having a piezoelectric thin film and a pair of second excitation electrodes, the piezoelectric thin film being connected to one vibration arm portion of the pair of vibration arm portions at an outer circumference of the piezoelectric thin film, the pair of second excitation electrodes sandwiching the piezoelectric thin film in a thickness direction, the first vibrating body being configured to generate a contour vibration by performing expansion and contraction between a center and the outer circumference of the piezoelectric thin film;
   a second vibrating body including a vibration plate with a piezoelectric thin film and a pair of third excitation electrodes, the piezoelectric thin film being connected to the other vibration arm portion of the pair of vibration arm portions at an outer circumference of the piezoelectric thin film, the pair of third excitation electrodes sandwiching the piezoelectric thin film in a thickness direction, the second vibrating body being configured to generate a contour vibration in phase with the contour vibration of the first vibrating body;

a first extraction electrode disposed at the one vibration arm portion, the first extraction electrode being connected to the second excitation electrode of the first vibrating body;

a second extraction electrode disposed at the other vibration arm portion, the second extraction electrode being connected to the third excitation electrode of the second vibrating body; and an input/output port disposed at the base portion and configured to input/output an electric signal to/from each of the first extraction electrode, the second extraction electrode, and the first excitation electrodes of the pair of vibration arm portions, wherein the tuning fork type vibrating body is configured to generate a flexural vibration in reverse phase to the contour vibration of the first and second vibrating bodies, so as to absorb the contour vibration of the first and second vibrating bodies.

2. The vibrator according to claim 1, further comprising electrode patterns configured to adjust respective resonance frequencies of the first and second vibrating bodies, wherein the electrode patterns are foiled at the one vibration arm portion and the other vibration arm portion.

3. The vibrator according to claim 2, wherein each of the electrode patterns is obtained by forming a plurality of electrode films by interposing a gap area between the electrode films.

4. The vibrator according to claim 2, wherein the electrode pattern formed at the one vibration arm portions and the electrode pattern formed at the other vibration arm portion are symmetrical to each other by interposing a line between the one vibration arm portion and the other vibration arm portion.

5. The vibrator according to claim 1, wherein one of the first excitation electrodes formed at the one vibration arm portion and the other first excitation electrode formed at the other vibration arm portion also serve as the first and second extraction electrodes, respectively.

6. The vibrator according to claim 1, wherein the base portion formed at the one vibration arm portion and the base portion formed at the other vibration arm portion are supported by the base substrate, and the input/output port is disposed at each of the base portions.

7. The vibrator according to claim 1, wherein the one vibration arm portion and the other vibration arm portion each has a connecting portion with the base portion and a connecting portion with the vibration plate, the connecting portion with the base portion is smaller than the connecting portion with the vibration plate in at least one dimension of broadness and thickness.

8. The vibrator according to claim 7, wherein the one vibration arm portion and the other vibration arm portion are symmetrical to each other in an intermediate position of the pairs of vibration arm portions with respect to a line on a top plan view, the line extending in a longitudinal direction of the pair of vibration arm portions.

9. The vibrator according to claim 7, wherein the pair of vibration arm portions, the vibration plate in the first vibrating body, and the vibration plate in the second vibrating body are formed at the same time by dry etching process using a photoresist mask, and the pair of vibration arm portions are formed such that a dimension in the connecting portion with the base portion is smaller than a dimension in the connecting portion with the vibration plate.

10. The vibrator according to claim 7, wherein the respective vibration arm portions gradually decreases in width from the connecting portion with the vibration plate toward the connecting portion with the base portion.

11. The vibrator according to claim 7, wherein the base portion is disposed at each of one end and the other end in a longitudinal direction of the pair of vibration arm portions.

12. An electronic component comprising the vibrator according to claim 1.

13. A method of manufacturing the vibrator according to claim 1, the method comprising:

forming a tuning fork type vibrating body over a base substrate, the tuning fork type vibrating body including a base portion, a pair of vibration arm portions having a pair of first excitation electrodes, the base portion being supported by the base substrate, the pair of vibration arm portions extending from the base portion away from each other, each of the pair of vibration arm portions including a piezoelectric body, and the pair of first excitation electrodes sandwiching each of the vibration arm portions;

forming a first vibrating body by: connecting an outer circumference of a piezoelectric thin film to one vibration arm portion of the pair of vibration portions, and sandwiching the piezoelectric thin film with a pair of second excitation electrodes in a thickness direction, so as to form the first vibrating body to generate a contour vibration by performing expansion and contraction between a center and the outer circumference of the piezoelectric thin film;

forming a second vibrating body by: connecting an outer circumference of a piezoelectric thin film to the other vibration portion of the pair of vibration arm portions, and sandwiching the piezoelectric thin film with a pair of third excitation electrodes in a thickness direction, so as to form the second vibrating body to generate a contour vibration in phase with the contour vibration of the first vibrating body;

forming a first extraction electrode connected to the second excitation electrode of the first vibrating body at the one vibration arm portion;

forming a second extraction electrode connected to the third excitation electrode of the second vibrating body at the other vibration arm portion;

forming an input/output port in the base portion to input/output an electric signal to/from each of the first extraction electrode, the second extraction electrode, and the first excitation electrodes of the pair of vibration arm portions; and forming electrode patterns configured to adjust respective resonance frequencies of the first and second vibrating bodies at the one vibration arm portion and the other vibration arm portion, respectively, wherein the tuning fork type vibrating body is configured to generate a flexural vibration in reverse phase to the contour vibration of the first and second vibrating bodies, so as to absorb the contour vibration of the first and second vibrating bodies.

14. The method according to claim 13, further comprising adjusting respective resonance frequencies of the first and second vibrating bodies while aligning the resonance frequencies by removing the electrode pattern after forming the electrode pattern, such that the electrode pattern of the one vibration arm portion and the electrode pattern of the other vibration arm portion are formed symmetrically to each other by interposing a line between one of the vibration arm portions and the other vibration arm portion.

\* \* \* \* \*